United States Patent
Hirai et al.

(10) Patent No.: US 7,266,034 B2
(45) Date of Patent: Sep. 4, 2007

(54) DATA RECORDING DEVICE

(75) Inventors: Takahiro Hirai, Yokohama (JP); Katsuyuki Naito, Tokyo (JP); Koichi Kubo, Yokohama (JP); Yuichi Motoi, Kawasaki (JP); Hiroshi Watanabe, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 15 days.

(21) Appl. No.: 11/366,465

(22) Filed: Mar. 3, 2006

(65) Prior Publication Data
US 2007/0030747 A1 Feb. 8, 2007

(30) Foreign Application Priority Data
Aug. 8, 2005 (JP) ............... 2005-229740

(51) Int. Cl.
*G11C 7/00* (2006.01)
(52) U.S. Cl. ............... 365/222; 365/227; 365/238.5
(58) Field of Classification Search ............... 365/222, 365/227, 238.5
See application file for complete search history.

(56) References Cited
U.S. PATENT DOCUMENTS

| | | | |
|---|---|---|---|
| 5,283,885 A | | 2/1994 | Hollerbauer |
| 5,550,781 A | * | 8/1996 | Sugawara et al. ......... 365/222 |
| 5,953,246 A | * | 9/1999 | Takashima et al. ......... 365/149 |
| 6,707,748 B2 | | 3/2004 | Lin et al. |
| 6,781,876 B2 | * | 8/2004 | Forbes et al. .......... 365/185.01 |
| 6,807,122 B2 | * | 10/2004 | Mizuno ............... 365/222 |

FOREIGN PATENT DOCUMENTS

| | | |
|---|---|---|
| JP | 2000-358090 | 12/2000 |
| JP | 2003-257187 | 9/2003 |
| JP | 2004-280971 | 10/2004 |

OTHER PUBLICATIONS

U.S. Appl. No. 10/612,405.
U.S. Appl. No. 11/154,628.
Watanabe et al., *Numerical Study of Data Retention Due to Direct Tunneling for Nonvolatile Memory Cell*, IEEE Transactions on Electron Devices, vol. 1, No. 5, May 2005, pp. 955-961.
Lee et al., *A Novel High K Inter-Poly Dielectric(IPD), $Al_2O_3$ for Low Voltage/High Speed Flash Memories: Erasing in msecs at 3.3V*, 1997 Symposium on VLSI Technology Digest of Technical Papers, p. 117-118.

* cited by examiner

*Primary Examiner*—Anh Phung
*Assistant Examiner*—Hien N Nguyen
(74) *Attorney, Agent, or Firm*—Nixon & Vanderhye P.C.

(57) ABSTRACT

An data recording device according to an aspect of the present invention includes a memory cell array in a memory chip, a refresh circuit which executes a refreshing of the memory cell array, a refresh control circuit which executes refreshing at a time interval which is shorter than a data hold time and manages a data hold time, and an internal power source which supplies a power source electric potential to the refresh circuit and the refresh control circuit in a state in which the data recording device is removed from an external device.

22 Claims, 29 Drawing Sheets

Flash memory

MRAM

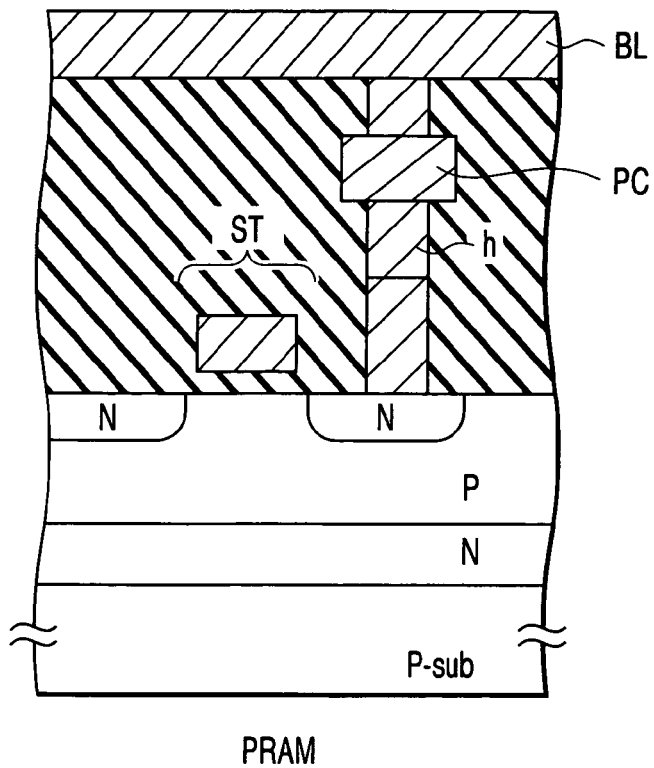
FIG. 17 PRAM
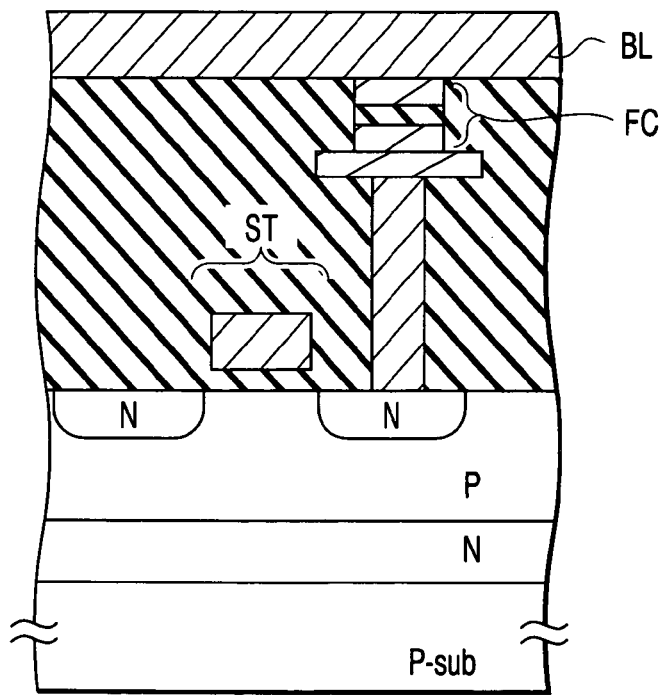
FIG. 18 FeRAM

Normally on type aging device
(after charge has been injected)
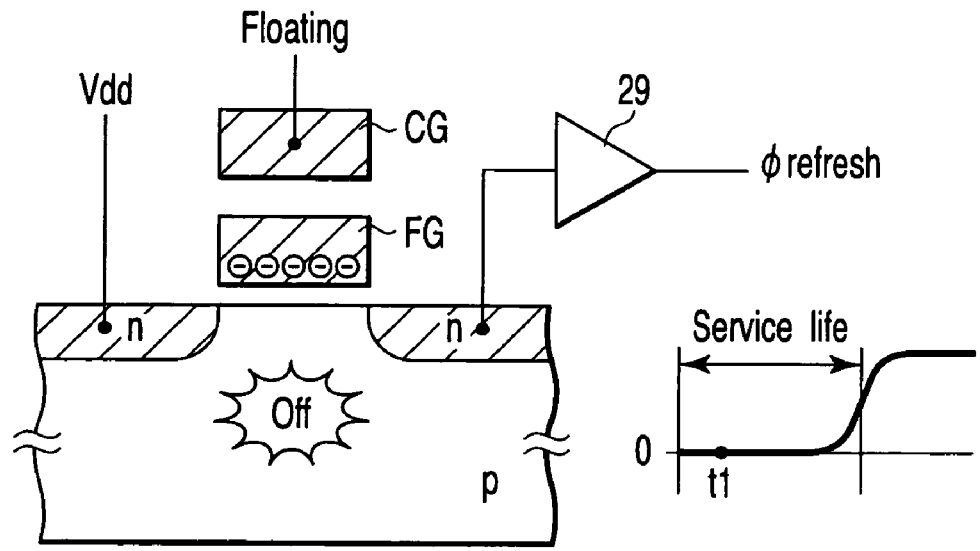
Elapse of predetermined time
Normally on type aging device
(after charge leaks)
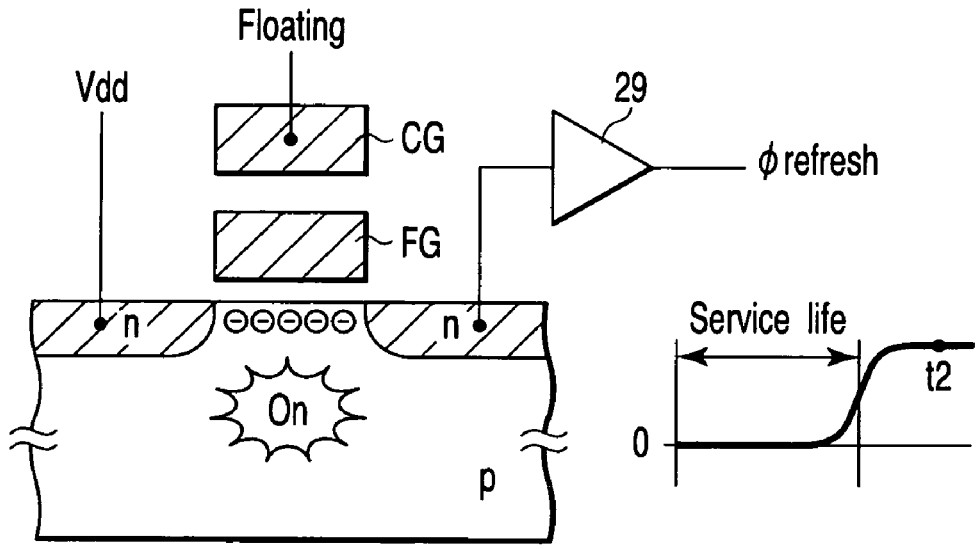
F I G. 21

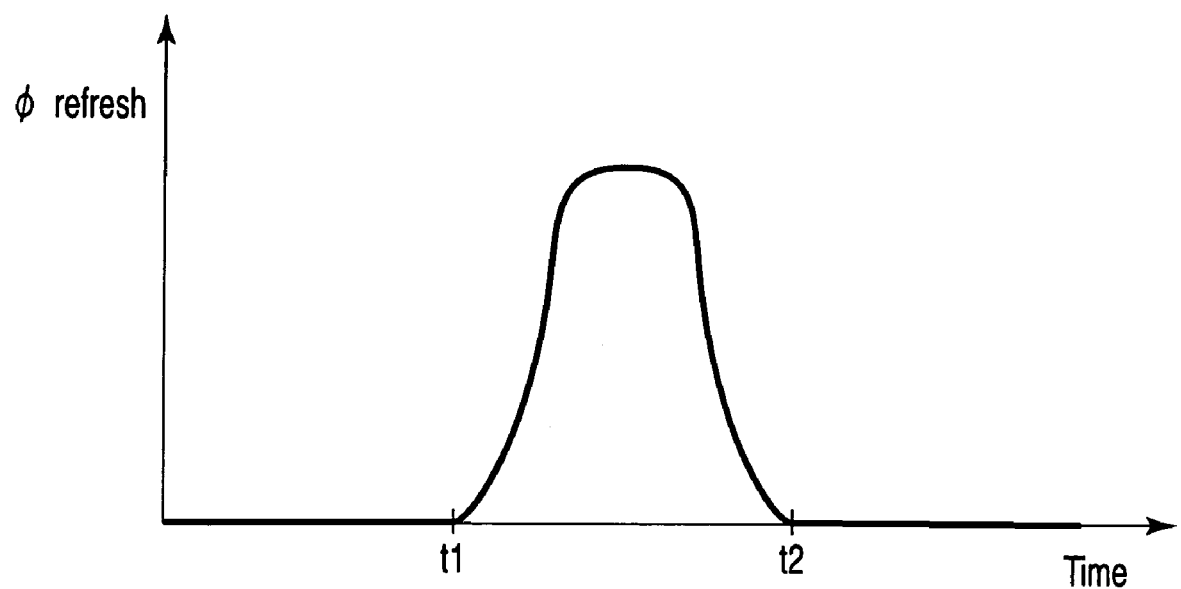
t1: All normally on type aging devices are on
t2: All normally on type aging devices are off
F I G. 24

DATA RECORDING DEVICE

CROSS-REFERENCE TO RELATED APPLICATIONS

This application is based upon and claims the benefit of priority from prior Japanese Patent Application No. 2005-229740, filed Aug. 8, 2005, the entire contents of which are incorporated herein by reference.

BACKGROUND OF THE INVENTION

1. Field of the Invention

The present invention relates to a management technique of a data hold time required by a file memory, and in particular, to a management technique applied to a high recording density file memory card requiring an inexpensive, downsized built-in battery.

2. Description of the Related Art

A memory card used in an external device such as a portable cellular phone or a personal computer must comprise a (removable) function capable of holding data even if the card is removed from the external device and not in use.

However, with respect to a file memory incorporated on a memory card, the downsizing of a memory cell advances to achieve low bit cost and high recording density. Thus, there occurs a problem that it becomes difficult to maintain a constant data hold time.

For example, by way of example of a NAND-type flash memory used as a file memory, if thinning a gate insulating film between a channel and a floating gate electrode and an inter-poly-insulating film between the floating electrode and the control gate electrode advances, a charge in the floating gate electrode is likely to leak. As a result, a data hold time is reduced (reference should be made to H. Wo et al. IEEE Trans. ED52, (5) 955 (2005), for example).

The thinning of the gate insulating film and the inter-poly-insulating film is indispensable from the viewpoint of strengthening capacitance coupling in memory cells and precluding interference between the memory cells due to downsizing. Thus, the problem with this reduced data hold time must be solved from other points of view.

First, from the viewpoint of a material, there is known a technique of using an inter-poly-insulating film made of a high dielectric material (reference should be made to W. H. Lee et al. Tech. Dig. VLSI symp; 117 ('97)).

However, at the present stage, there has not been found a material having two properties, good affinity with a silicon process and infrequent occurrence of leakage.

In addition, the problem with reduced data hold time cannot be sufficiently solved merely by changing a material. This is because the thinning of a tunnel insulating film and the inter-poly-insulating film results in more dispersion in memory. In this case, if the insulating film of the memory cell whose thickness deviates to be thin fail to meet a condition for a data hold time (for example, one year or more), it causes the lowered yield of manufacturing.

Second, from the viewpoint of a system, there is known a technique of refreshing memory cell data by using a battery (reference should be made to Jap. Pat. Appln. KOKAI publication No. 2004-280971).

In addition, a card incorporating a battery is also known (for example, reference should be made to Japanese Patent Application Laid-open No. 2000-358090 and U.S. Pat. No. 6,707,748). In order to actually incorporate batteries in these cards, power required for clock generation or timer operation and the like must be reduced, and battery capacitance must be reduced.

Third, as a nonvolatile memory incorporated in a memory card, there is known a technique of using a novel memory such as a ferromagnetic memory, an MRAM (magnetic random access memory), an OUM (ovonics unified memory) as a phase change RAM, instead of the NAND-type flash memory.

However, the ferromagnetic memory and MRAM are not suitable for a file memory because a cost per bit is high as compared with that of the flash memory. In addition, the OUM is high in power consumption during write/erase operation, and a technique of reducing an off-leak without increasing a bit cost still remains unsolved.

Further, with respect to these novel memories as well, there occurs a problem that data hold characteristics are impaired due to thermal disturbance.

On the other hand, there has been reported a semiconductor integrated circuit having incorporated therein an electronic timer which does not require a battery, in particular, a semiconductor integrated circuit composed of an aging device whose output changes with time (reference should be made to Jap. Pat. Appln. KOKAI publication No. 2004-172404, for example).

BRIEF SUMMARY OF THE INVENTION

An data recording device according to an aspect of the present invention comprises: a semiconductor memory; a refresh circuit which executes a refreshing of data of the semiconductor memory; a refresh control circuit which manages a data hold time of the semiconductor memory for refreshing at a time period which is shorter than the data hold time; and an internal power source which supplies power for executing the refreshing in a state in which the data recording device is removed from an external device.

An data recording device according to an aspect of the present invention comprises: a semiconductor memory; a refresh circuit which executes a refreshing of data of blocks or pages of the semiconductor memory; a refresh control circuit which manages a data hold time of each block or each page of the semiconductor memory, for refreshing at a time interval which is shorter than the data hold time; a directive memory which stores a history of a write/erase operation of the each block or the each page; and an internal power source which supplies power for executing the refreshing in response to the history in a state in which the data recording device is removed from an external device.

BRIEF DESCRIPTION OF THE SEVERAL VIEWS OF THE DRAWING

FIG. 17 is a view showing an example of a device structure of a PRAM;

FIG. 18 is a view showing an example of a device structure of an FeRAM;

FIG. 21 is a diagram showing a principle of the aging device;

FIG. 24 is a view showing an example in which a refresh signal is formed as a pulse waveform;

DETAILED DESCRIPTION OF THE INVENTION

Figure 1:
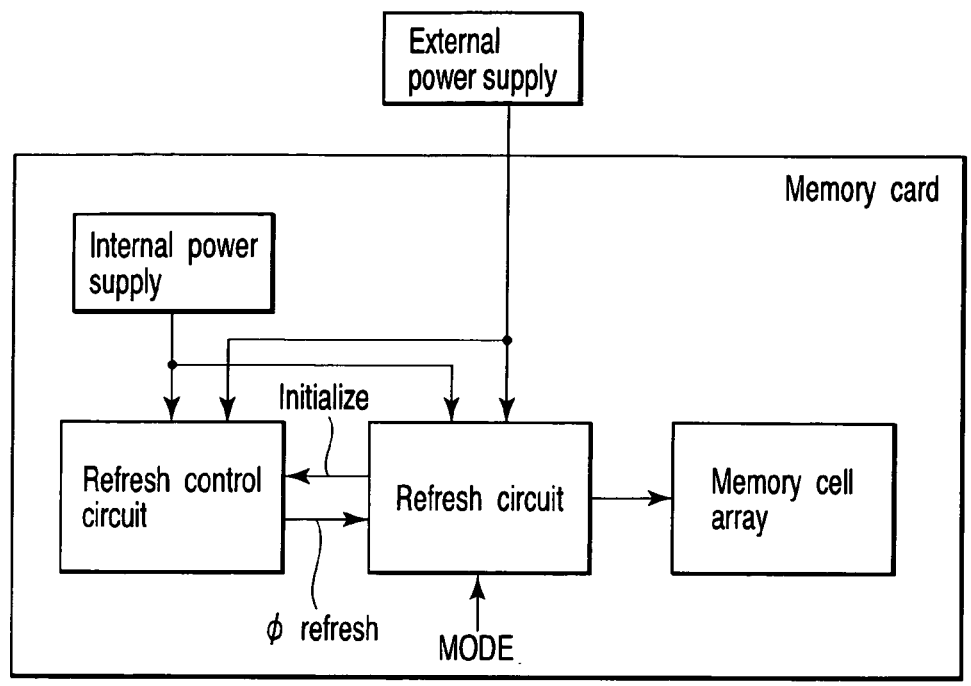
FIG. 1 is a diagram showing configuration 1 according to an example of the present invention.

A data recording device of an aspect of the present invention will be described below in detail with reference to the accompanying drawing.

1. OUTLINE

A memory card serving as a data recording device requires removable property. In order to maintain this removable property, in an example of the present invention, there is proposed a technique of refreshing a file memory with lower power consumption.

Refreshing must be carried out before memory cell data is eliminated due to leakage. Therefore, in an example of the present invention, a memory cell data hold time is managed by a refresh control circuit (timing module), and refreshing is carried out at a time interval which is shorter than the data hold time.

In addition, an internal power source is incorporated in a memory card because refreshing requires power consumption. The internal power source is composed of batteries or capacitors. The internal power source may be provided independently of a chip or may be incorporated in the chip.

It is difficult to incorporate the internal power source having a large capacitance in the memory card because of limitation to its size. In such a situation as well, power consumption required for refreshing must be reduced in order to maintain removable property of the memory card.

Therefore, for example, a refresh control circuit (timing module) is composed of aging devices.

The aging devices cannot manage precise time, unlike a crystal oscillation type timer. However, it is possible to set a time which is shorter than the shortest data hold time based on dispersion in film thickness. Their power consumption is sufficiently lower than that of a timer utilizing a clock with a crystal oscillator or a CMOS circuit.

Therefore, according to an example of the present invention, a file memory data hold time is managed with slight power consumption and file memory refreshing is approximately periodically carried out, whereby the internal battery is downsized, and memory card removal property can be maintained.

In the present specification, the memory card used here refers to a data recording device whose primary object is to record file data.

That is, the memory card does not include a data processing unit such as a personal computer whose primary object is to process file data, and its shape is not limited as long as the memory card is a data recording device whose primary object is to record file data. For example, the shapes of the memory card, of course, include a cubic shape, a spherical shape, and any other complicated shape.

In addition, the data hold time denotes a time during which the memory cell can hold data continuously without data loss from a time point at which the data has been written in the memory cells.

When an example of the present invention is applied, the type of a semiconductor memory serving as a file memory is not limited in particular. For example, nonvolatile memories such as EPROM, flash memory, ferromagnetic memory, MRAM, and OUM can be used.

2. CONFIGURATION

FIG. 1 shows configuration 1 of a memory card according to an example of the present invention. In configuration 1, an internal power source for refresh operation, a refresh circuit and a refresh control circuit are incorporated in the memory card.

The refresh circuit is installed as a peripheral circuit which includes a write/read/erase circuit, a step-up circuit and the like, and has a function of refreshing the data stored in a memory cell array.

When the memory card is inserted into an external device, a power source electronic potential is supplied from a power source (external power source) of the external device to each of the refresh control circuit and refresh circuit. Having received a mode signal "MODE" indicating a write operation from the external device, for example, the refresh circuit executes the data write operation into memory cells and initializes the refresh control circuit.

On the other hand, when the memory card is removed from the inside of the external device and is left as is, power is supplied from an internal power source incorporated in the memory card to each of the refresh control circuit and refresh circuit. The refresh control circuit manages a data hold time required by memory cells from a time point at which the data write operation terminates, and outputs to the refresh circuit a refresh signal $\phi$ refresh instructing that refreshing starts at a time interval which is shorter than the data hold time.

After refreshing has terminated, or after memory cell data erasing and rewriting has been executed before refreshing is carried out, the refresh control circuit is initialized. This refresh control circuit manages an elapse of time from an initialization time as a data hold time again.

Figure 2:
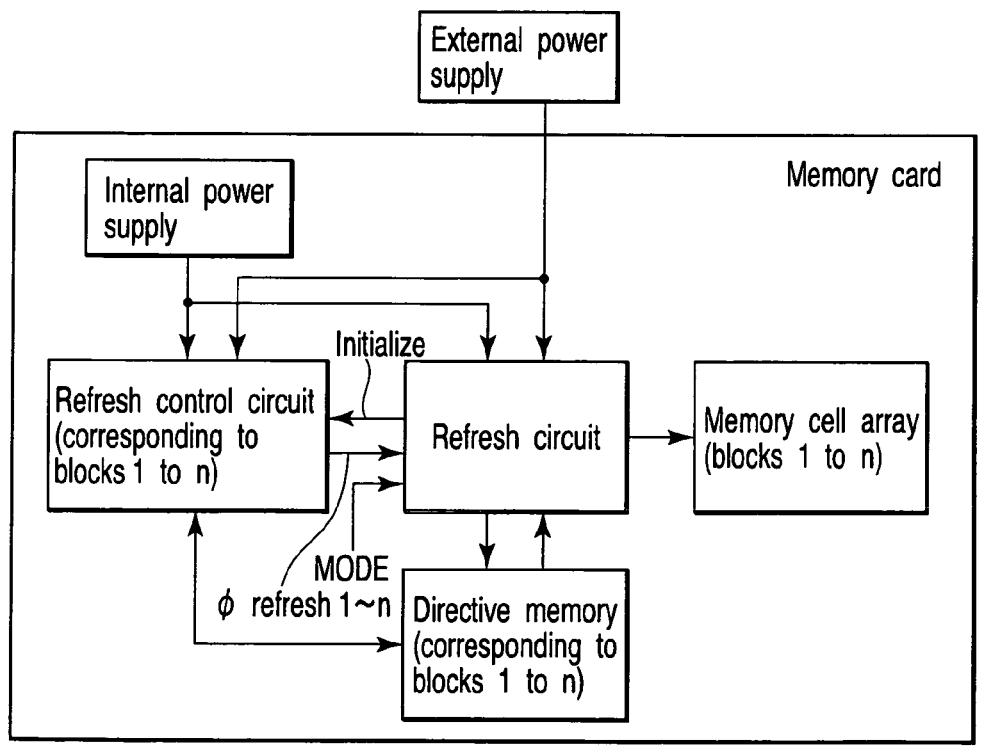
FIG. 2 is a diagram showing configuration 2 according to an example of the present invention.

FIG. 2 shows configuration 2 of a memory card according to an example of the present invention.

Configuration 2 includes features of configuration 1. Further, in configuration 2, a directive memory is added as a constituent element.

A memory cell array is composed of a plurality of blocks 1 to n, and each block is composed of a plurality of pages. Data is written or read, for example, in units of pages, and data is erased, for example, in units of blocks.

The directive memory is installed in units of blocks or in units of pages. The memory stores data for identifying a block or a page in use in which data is stored and an unused block or page in which no data is stored.

When a memory card is inserted into an external device, a power source electric potential is supplied from a power source (external power source) of the external device to each of the refresh control circuit and the refresh circuit.

The refresh circuit having received a mode signal MODE indicating the write operation into a page which belongs to block 1 from the external device, for example, executes the data write operation into that page and executes a data write operation indicating that block 1 is a block in which data has been stored, in the directive memory corresponding to block 1.

At the same time, a portion corresponding to block 1 of the refresh control circuit is initialized.

On the other hand, when the memory card is removed from the inside of the external device and is left as is, power is supplied from an internal power source incorporated in the memory card to each of the refresh control circuit and the refresh circuit.

A portion corresponding to block 1 of the refresh control circuit manages a data hold time required by block 1 from a time point at which the write operation into a page belonging to block 1 of the memory cell array has terminated; and outputs a refresh signal $\phi$ refresh 1 instructing a page targeted for refreshing to the refresh circuit based on recording of the directive memory corresponding to block 1 at a time interval which is shorter than the data hold time.

After refreshing relevant to block 1 has terminated, or after data erase and rewrite has been executed with respect to block 1 before carrying out refreshing relevant to block 1, a portion corresponding to block 1 of the refresh control circuit records the contents of execution in the directive memory and manages the data hold time from the start again (initialization).

3. EMBODIMENTS

Now a description will be given with respect to some embodiments which seem to be the best.

(1) First Embodiment

A first embodiment relates to an embodiment of configuration 1.

Figure 3:
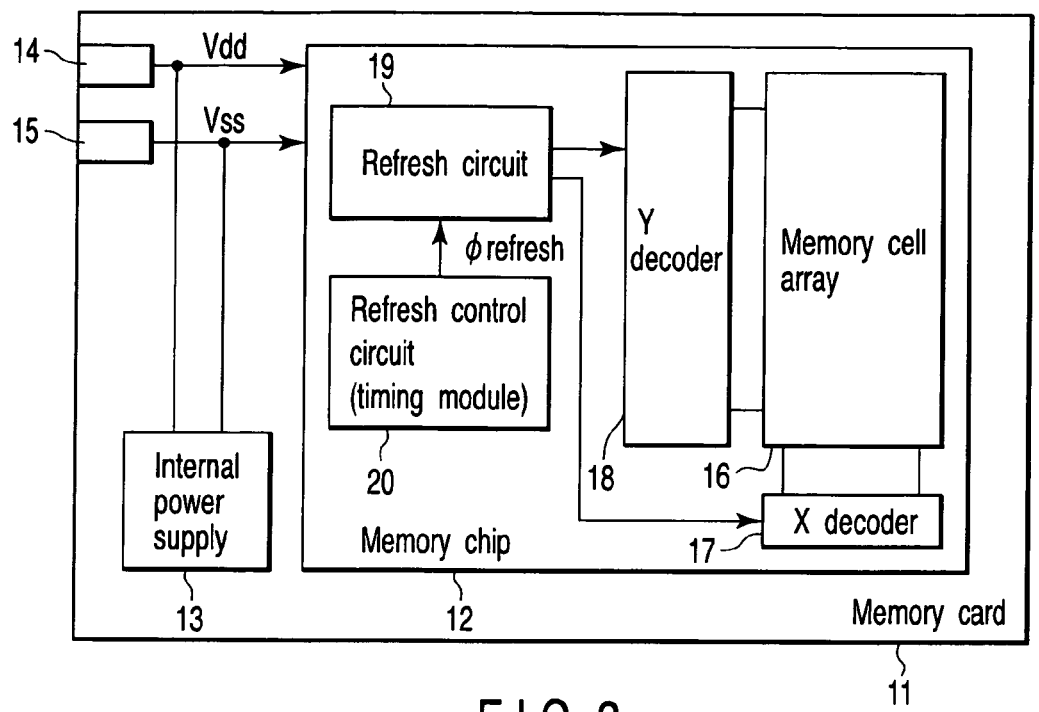
FIG. 3 is a diagram showing a memory card according to a first embodiment.

FIG. 3 shows a memory card according to the first embodiment of the present invention. A memory chip 12 serving as a file memory is incorporated in a memory card 11. The memory chip 12 includes a memory cell array 16, an X decoder 17, a Y decoder 18, a refresh circuit 19, and a refresh control circuit (timing module) 20.

The refresh circuit 19 having received a refresh signal $\phi$ refresh from the refresh control circuit 20 refreshes data contained in the memory cell array 16.

A refresh operation is executed by reading out data contained in the memory cell array 16 and writing the read data into the memory cell array again. As a specific refresh operation, for example, a refresh operation of a dynamic random access memory can be applied as is.

The refresh control circuit 20 functions as a timing module, manages a data hold time required by the memory cell array 16, and outputs a refresh signal $\phi$ refresh for starting a refresh operation of the memory cell array 16 at a time interval (refresh timing) which is shorter than this data hold time.

The refresh control circuit 20 can be composed of timers and aging devices. A description will be given later.

The data hold time required by the memory cell array 16 is statistically grasped in advance by test at the time of manufacture of the memory chip 12. A refresh timing which is within an allowable range and which is sufficiently shorter than life of memory cells having the shortest data hold time is determined.

Power supply terminals 14 and 15 are provided in the memory card 11. When the memory card 11 is inserted into an external device, power source electric potentials Vdd and Vss are supplied from the power source terminals 14 and 15 to the memory chip 12.

In addition, an internal power source 13 is incorporated in the memory card 11. The internal power source 13 is used as a power source for a refresh operation relevant to the memory cell array 16 in a state in which the memory card 11 is removed from the external device and is left as is.

The internal power source 13 is composed of a capacitance element such as battery or capacitor. In the case where the internal power source 13 is composed of battery and the refresh control circuit 20 is composed of timer, a Li ion secondary battery having electric discharge capacity of 0.10 Wh is used as battery.

Further, in the case where the internal power source 13 is composed of battery and the refresh control circuit 20 is composed of an aging device, a Li ion secondary battery having electric discharge capacitance of 0.04 Wh is used as battery.

With respect such a configuration, the memory chip 12 incorporated in the memory card 11 has a refresh function and the internal power source 13 for the refresh operation is provided in the memory card 11. Therefore, even if the data hold time required by the memory chip 12 is reduced due to high integration, the removable property of the memory card 11 can be maintained.

(2) Second Embodiment

A second embodiment relates to an embodiment of configuration 1.

Figure 4:
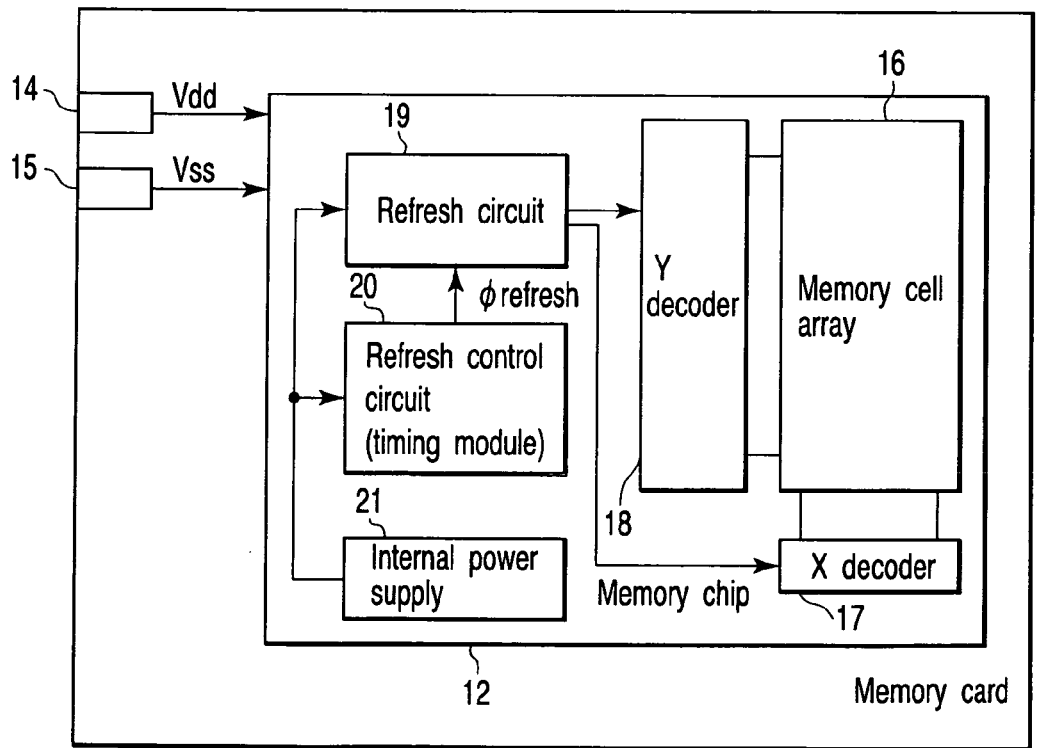
FIG. 4 is a diagram showing a memory card according to a second embodiment.

FIG. 4 shows a memory card according to the second embodiment of the present invention.

The memory chip 12 is incorporated in the memory card 11. The memory chip 12 includes a memory cell array 16, an X decoder 17, a Y decoder 18, a refresh circuit 19, a refresh control circuit (timing module) 20, and an internal power source 21.

The refresh circuit 19 outputs a control signal which includes an address signal for refreshing data contained in the memory cell array 16. The refresh operation is executed by reading out data contained in the memory cell array 16 and writing the read data into the memory cell array 16 again, as in the first embodiment.

The refresh control circuit 20 functions as a timing module, manages a data hold time required by the memory cell array 16, and outputs a refresh signal ϕrefresh for starting the refresh operation of the memory cell array 16 at a time interval (refresh timing) which is shorter than this data hold time.

The refresh control circuit 20 can be composed of timers, aging devices and the like, for example, as in the first embodiment.

The data hold time required by the memory cell array 16 is also precisely grasped by test at the time of manufacture of the memory chip 12, as in the first embodiment.

Power supply terminals 14 and 15 are provided in the memory card 11. When the memory card 11 is inserted into the external device, power source electric potentials Vdd and Vss are supplied from the power source terminals 14 and 15 to the memory chip 12.

In addition, the memory chip 12 incorporates an internal power source 21. The internal power source 21 is used as a power source for refresh operation relevant to the memory cell array 16 in a state in which the memory card 11 is removed from the external device and not in use.

While the internal power source 21 is composed of a capacitance element such as capacitor, this power source may be batteries under a condition in which they can be formed on the chip.

With such a configuration, the memory chip 13 incorporated in the memory card 11 has a refresh function and incorporates the internal power source 12 for the refresh operation. Therefore, even if the data hold time required by the memory chip 12 is reduced, the removable property of the memory card 11 can be maintained.

(3) Third Embodiment

A third embodiment relates to an embodiment of configuration 2.

Figure 5:
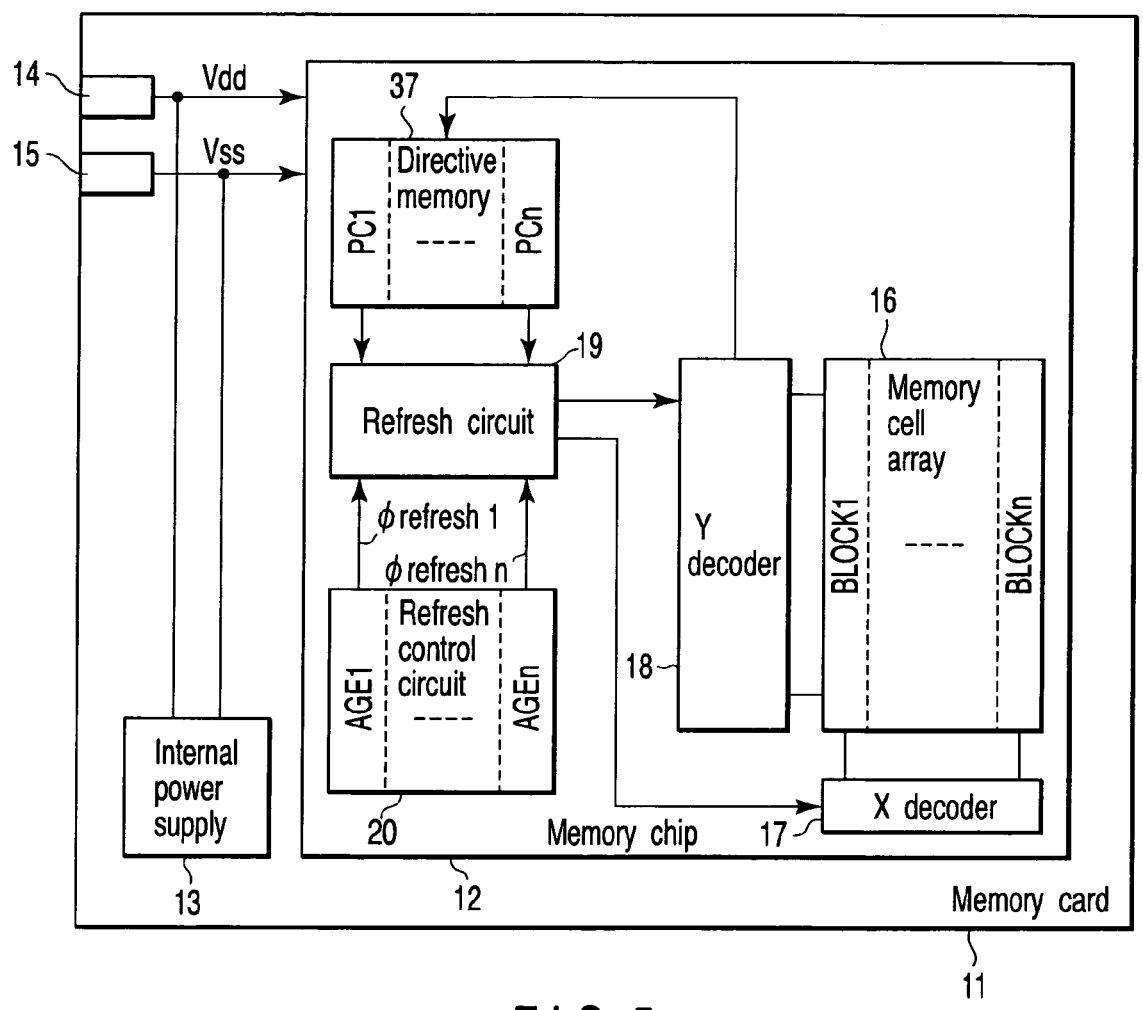
FIG. 5 is a diagram showing a memory card according to a third embodiment.
Figure 6:
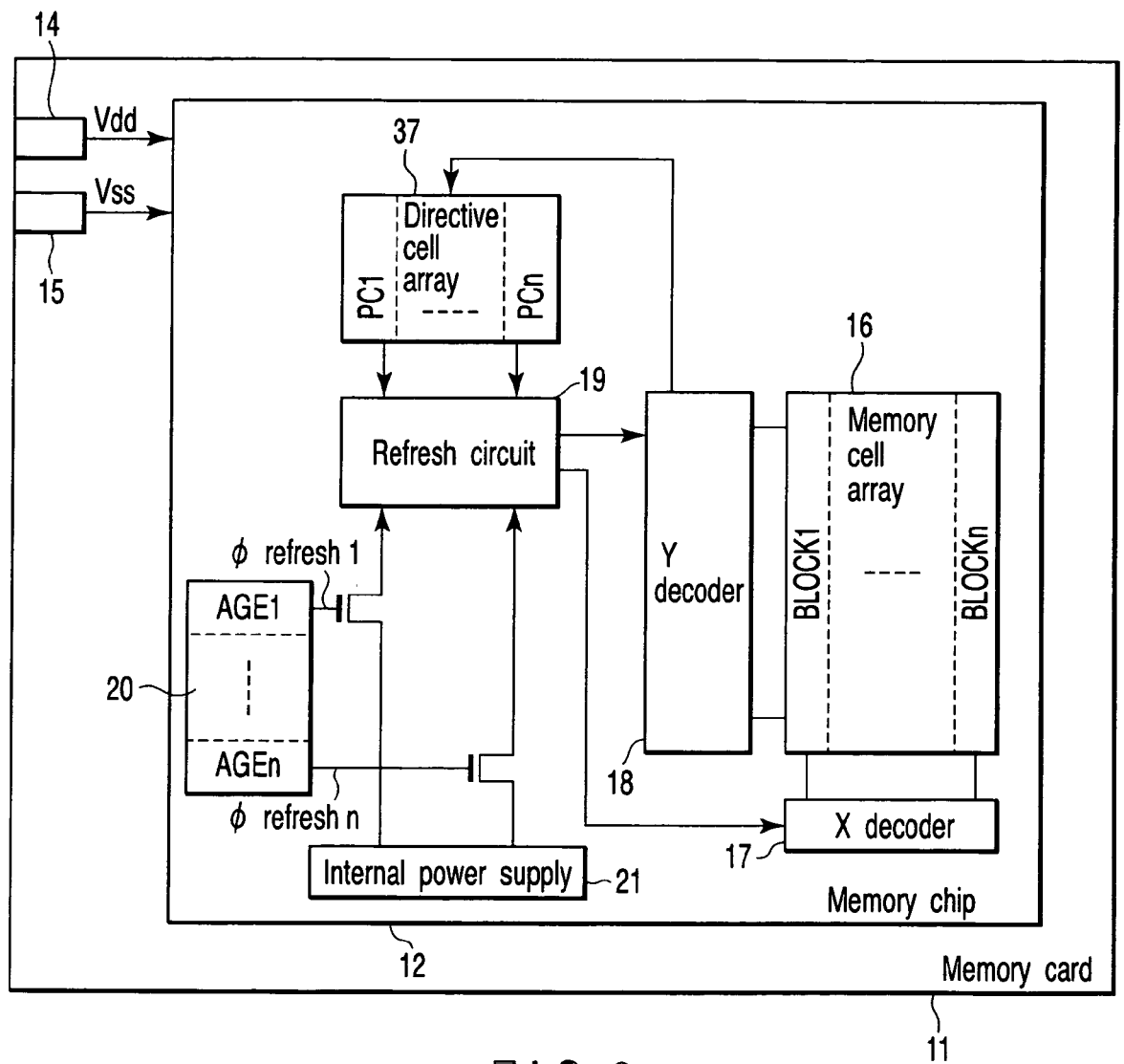
FIG. 6 is a diagram showing a memory card according to the third embodiment.

FIGS. 5 and 6 each show a memory card according to the third embodiment of the present invention.

The memory chip 12 serving as a file memory is incorporated in the memory card 11. The memory chip 12 includes a memory cell array 16, an X decoder 17, a Y decoder 18, a refresh circuit 19, a refresh control circuit 20, and a directive memory 37.

The memory cell array 16 is composed of n (n is a plurality) blocks BLOCK1 to BLOCKn, and each block is composed of a plurality of pages. Pages are units consisting of a plurality of memory cells connected to a common word line. For example, data write/read is executed in units of pages, and data erase is executed in units of blocks.

The refresh control circuit 20 is composed of, for example, n aging device sections AGE1 to AGEn which correspond to n blocks BLOCK1 to BLOCKn.

In this example, while the directive memory 37 is allocated as part of the peripheral circuits, this memory may be part of the memory cell array 16. The directive memory 37 is composed of n directive cell sections PC1 to PCn which correspond to the n blocks BLOCK1 to BLOCKn of the memory cell array 16.

Each of the directive cell sections PC1 to PCn is composed of, for example, one or more memory cells having the same structure as those configuring the memory cell array 16.

The directive cell sections PC1 to PCn each store a write/erase history for identifying whether one of the blocks BLOCK1 to BLOCKn in the corresponding cell array 16 is a block in use in which data is stored or is an unused block in which no data is stored.

Figure 7:
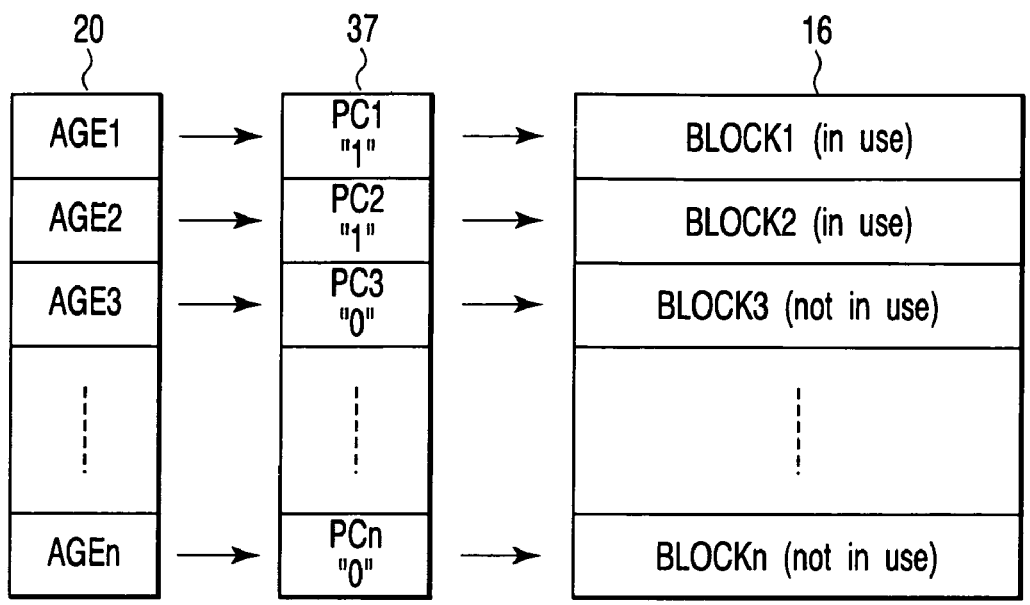
FIG. 7 is a diagram showing a part of the memory card according to the third embodiment.

For example, as shown in FIG. 7, in the case where blocks BLOCK1 and BLOCK2 are used, data "1" is written into the directive cell sections PC1 and PC2, and data remains "0" in the directive cell sections PC3 to PCn which correspond to unused blocks BLOCK3 to BLOCKn.

Here, each of the directive cell sections PC1 to PCn is composed of a plurality of bits, for example, 10 bits in consideration of the fact that a faulty bit is generated, and use/unused block is determined based on an average value of data of the plurality of bits.

In this case, for example, even if one of the 10 bits of the directive cell section PC1 is faulty, it is determined whether the average value is greater or smaller than an intermediate value between "0" and "1" (here, 0.5), thereby making it possible to precisely determined whether the block BLOCK1 is used/unused.

Here, in the case where a flash memory chip is used as the memory chip 12, aging device sections AGE1 to AGEn and the directive cell sections PC1 to PCn can be composed of memory cells having the same structure as those of the flash memory, respectively.

In this case, when the tunnel film thickness of the memory cells of the memory cell array 16 is set to tox2, the tunnel film thickness of the memory cells (aging device) configuring aging device sections AGE1 to AGEn is set to tox1 (<tox2).

In addition, the thickness of a gate insulating film of the memory cells configuring directive cell sections PC1 to PCn is set to tox3 (>tox2>tox1) or tox3 (=tox2>tox1).

In the case where tox3>tox2>tox1, a leak of memory cells configuring the directive cell sections PC1 to PCn is lower than that of the memory cells of the memory cell array 16.

In this case, there is no need for carrying out refreshing with respect to the directive cell sections PC1 to PCn. In addition, when cells are allocated at the peripheral circuit sections, the number of film making steps can be decreased.

In the case of tox3=tox2>tox1, the cell intervals of the directive memory 37 are set to be large than those of the memory cell array 16 so as not to cause errors due to a data loss of the directive memory 37 earlier than the data contained in the memory cell array 16. Then, a leak of memory cells configuring the directive cell sections PC1 to PCn is made lower than that of the memory cells of the memory cell array 16.

In this case, the directive cell sections PC1 to PCn can be formed to have film thickness equal to that of the memory cells. Thus, these cell sections can be fabricated in accordance with the same steps as those of the memory cell array. In this case as well, there is an advantage that the number of steps can be reduced.

The refresh circuit 19 outputs a control signal which includes an address signal for refreshing data contained in the memory cell array 16 in units of blocks based on the refresh signals φrefresh 1 to φrefresh n from the refresh control circuit 20 and the write/erase history stored in the directive memory 37.

A refresh operation is executed by reading out data contained in a selected block BLOCKi (i=1 to n) targeted for refreshing, and then, writing the read data into the selected block BLOCK1 again.

Aging device sections AGE1 to AGEn configuring the refresh control section 20 each manage a data hold time required by blocks BLOCK1 to BLOCKn of the memory cell array 16 in units of pages and output a refresh signal φrefresh i (i=1 to n) for starting a refresh operation relevant to the corresponding block BLOCKi (i=1 to n) at a time interval which is shorter than this data hold time.

Internal power supplies 13 and 21 of the memory card 11 each are composed of capacitance elements such as batteries or capacitors. In the example shown in FIG. 5, the internal power source 13 is provided independently of the memory chip 12. In the example shown in FIG. 6, the internal power source 21 is incorporated in the memory chip 12.

When the memory card 11 is inserted into the external device, the power source electric potentials Vdd and Vss are supplied into the memory chip 12 from the power source (external power source) of the external device.

For example, when the external device instructs the write operation into the blocks BLOCK1 and BLOCK2, as shown in FIG. 7, the data write operation into the blocks BLOCK1 and BLOCK2 of the memory cell array 16 is executed and "1" is written into the directive cell sections PC1 and PC2 of the directive memory 37. At the same time, the aging device sections AGE1 and AGE2 are initialized.

In addition, when the memory card 11 is removed from the inside of the external device and is left as is, the internal power supplies 13 or 21 incorporated in the memory card 11 are used as power supplies for refreshing.

The aging device sections AGE1 and AGE2 manage a data hold time required by the blocks BLOCK1 and BLOCK2 from a time point at which the write operation into the blocks BLOCK1 and BLOCK2 has terminated, and outputs refresh signals φrefresh 1 and φrefresh 2 which instruct the start of the refresh operation relevant to the blocks BLOCK1 and BLOCK2 at a time interval which is shorter than the data hold time.

Here, there is no need for carrying out data hold time management and refresh operation with respect to the blocks BLOCK3 to BLOCKn in which no data is written. Thus, with the directive memory 37 employed, it is made possible to contribute to low power consumption.

After the refreshing relevant to the blocks BLOCK1 and BLOCK2 has terminated, or after data erase and rewrite has been executed with respect to the blocks BLOCK1 and BLOCK2 before carrying out refreshing relevant to the blocks BLOCK1 and BLOCK2, initialization relevant to the aging device sections AGE1 and AGE2 is also executed. Thus, the aging device sections AGE1 and AGE2 manage a data hold time again from the start (initialization).

It is preferable to execute a refresh operation with respect to the directive cell sections PC1 and PC2 of the directive memory 37 in accordance with a refresh operation relevant to the blocks BLOCK1 and BLOCK2.

In the case where data erase has been executed with respect to the blocks BLOCK1 and BLOCK2 before carrying out refreshing relevant to the blocks BLOCK1 and BLOCK2, data contained in the directive cell sections PC1 and PC2 are rewritten into "0". By doing this, no subsequent refreshing relevant to the blocks BLOCK1 and BLOCK2 is carried out, and thus, data hold time management is substantially canceled.

With such a configuration, the memory chip 12 incorporated in the memory card 11 has a refresh function and the internal power source 13 for a refresh operation is provided in the memory card 11.

In addition, data hold time management by the aging device section is carried out in units of blocks and a refresh operation of the memory cell array 16 is executed in units of blocks by the directive cell section of the directive memory 37.

Therefore, refreshing of the memory chip 12 serving as a file memory can be carried out with low power consumption, and, even if the data hold time required by the memory chip 12 is reduced due to downsizing, the removable property of the memory card 11 can be maintained.

4. MODIFIED EXAMPLE

Figure 8:
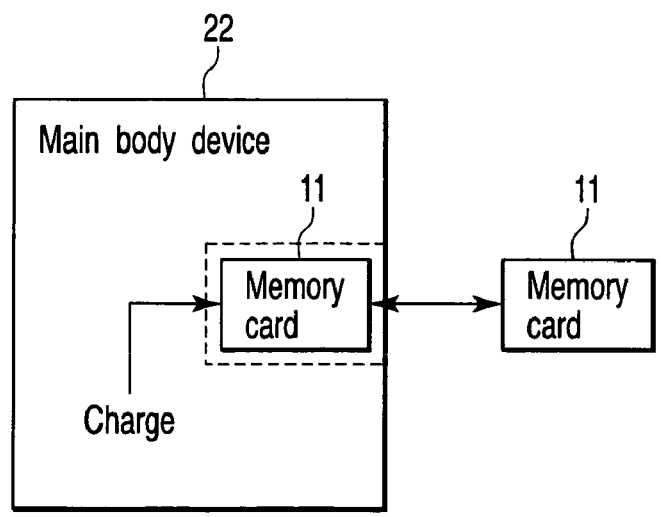
FIG. 8 is a diagram showing a relationship between an external device and a memory card.

FIG. 8 shows a modified example of the memory card according to the example of the present invention.

One of the features of the memory card according to the example of the present invention is that an internal power source is incorporated in the memory card 11.

Here, this power source cannot have a large capacitance because the size of the memory card 11 is limited.

Therefore, charging of the internal power source is carried out by using an external device 22 every time the memory card 11 is inserted into the external device 22.

In this manner, the removable property of the memory card 11 can be maintained in a semi-permanent manner.

The type of the external device 22 is not limited, and, for example, a variety of electronic devices such as a personal computer, a digital camera, or a portable cellular phone may be used.

5. EXAMPLE OF REFRESH CONTROL CIRCUIT

Figure 9:
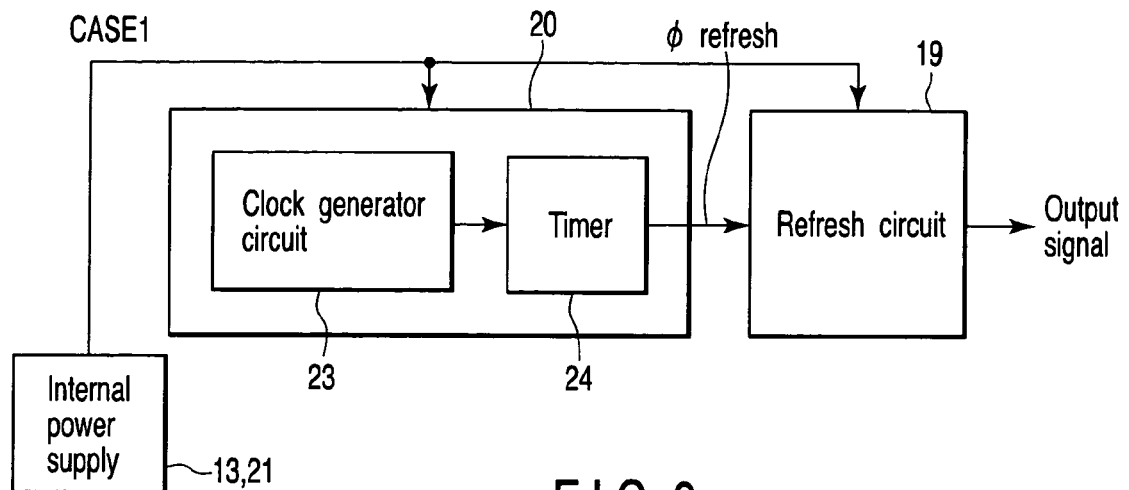
FIG. 9 is a diagram showing a first example of a refresh control circuit.

FIG. 9 shows a first example of a refresh control circuit.

In the first example (CASE 1), a refresh control circuit 20 is composed of a clock generator circuit 23 and a timer 24.

In this case, while a data hold time required by a memory cell array can be precisely managed by the timer 24, the clock generator circuit 23 and the timer 24 must always be operated when the data hold time is managed. Thus, a large amount of power is consumed while refreshing is in a standby mode.

Therefore, in the case where the first example is employed, the capacitance of the internal power source 13 or 21 must be sufficiently increased. When a quartz oscillator is used as the clock generator circuit 23, this quarts oscillator cannot be mounted on a memory chip, thus causing higher cost. Namely, there is another need for contrivance to reduce cost.

Figure 10:
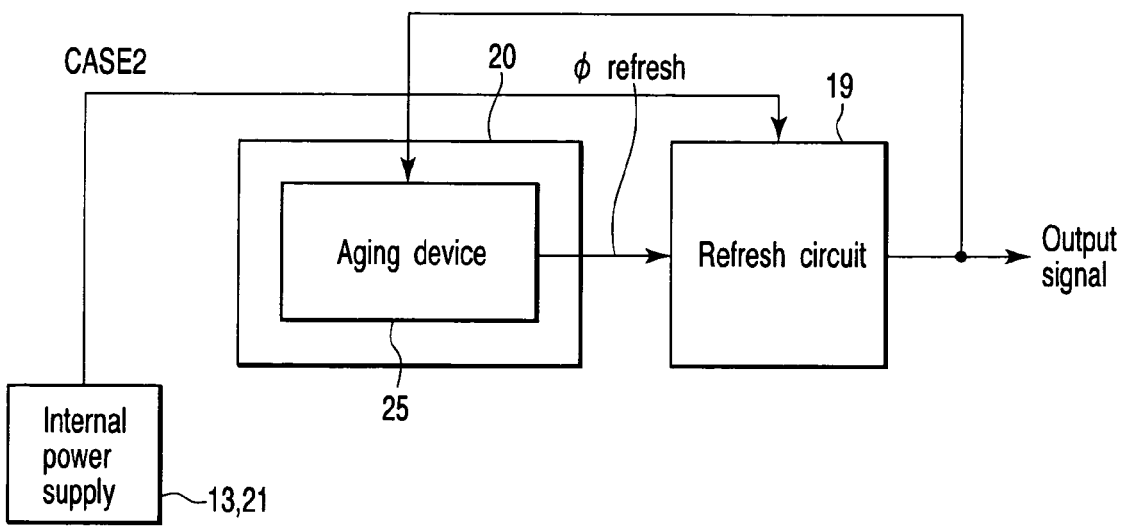
FIG. 10 is a diagram showing a second example of a refresh control circuit.

FIG. 10 shows a second example of a refresh control circuit.

In the second example (CASE2), a refresh control circuit 20 is composed of an aging device 25.

The aging device 25 hardly consumes power while in a refresh standby mode, although it is not precise with respect to time controllability. Thus, an internal power source of the memory card can be downsized.

The aging device 25 has the same structure as memory cells of a flash memory, for example. Thus, there is an advantage that the device can be incorporated in the memory chip 12 and a battery allocation space can be sufficiently provided.

In addition, a battery capacitance is proportional to its volume. Thus, the battery capacitance can be increased by sufficiently providing the battery allocation space. In this way, the above two advantages are attained, and the refresh enable count can be increased without charging.

Figure 11:
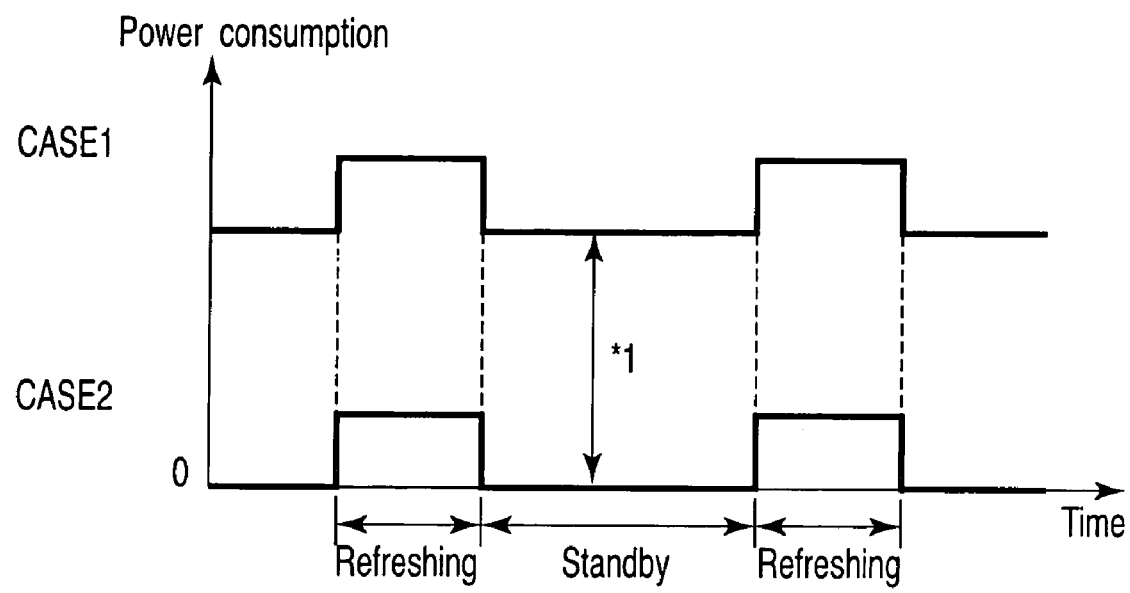
FIG. 11 shows comparing power consumption of the first and second examples.

FIG. 11 comparatively shows power consumption shown in CASE1 and CASE2.

Even if, in the first example (CASE1), the memory card is removed from the external device and is left as is, the clock generator circuit and timer must be operated. Thus, power is consumed while in a refresh standby mode.

In contrast, in the second example (CASE2), data hold time management is carried out by the aging device, and thus, power is not consumed while in a refresh standby mode. Namely, in the second example, power is consumed only at the time of refreshing, thus making it possible to contribute to downsizing of the internal power source.

6. EXAMPLE OF INTERNAL POWER SOURCE

First, a description will be given with respect to an example in the case where an internal power source is composed of a laminate capacitor. In the case where the internal power source is composed of the laminate capacitor, it is preferable that a refresh control circuit is composed of an aging device with low power consumption.

Figure 12:
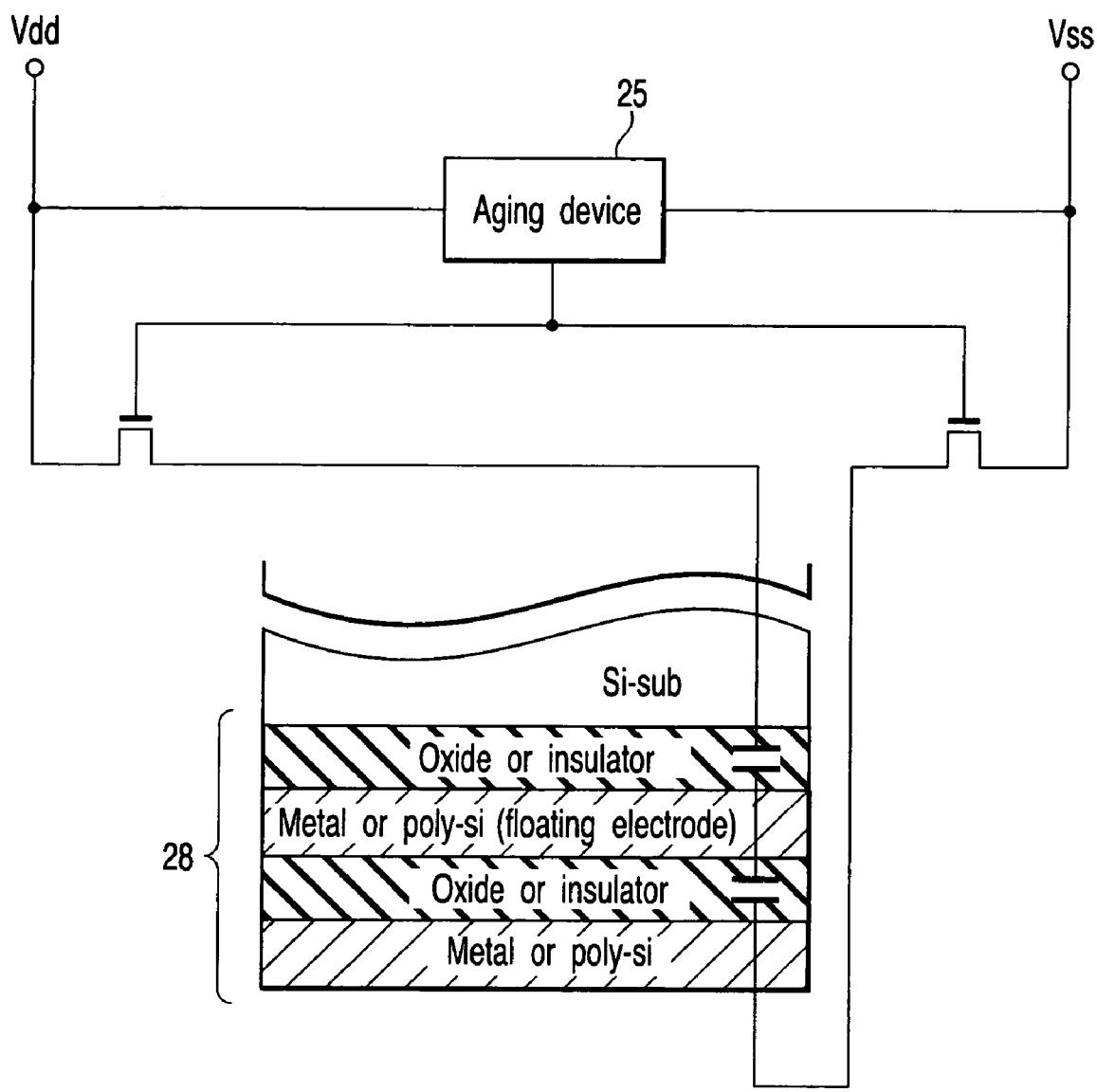
FIG. 12 is a diagram showing an example of a capacitor serving as an internal power source.
Figure 13:
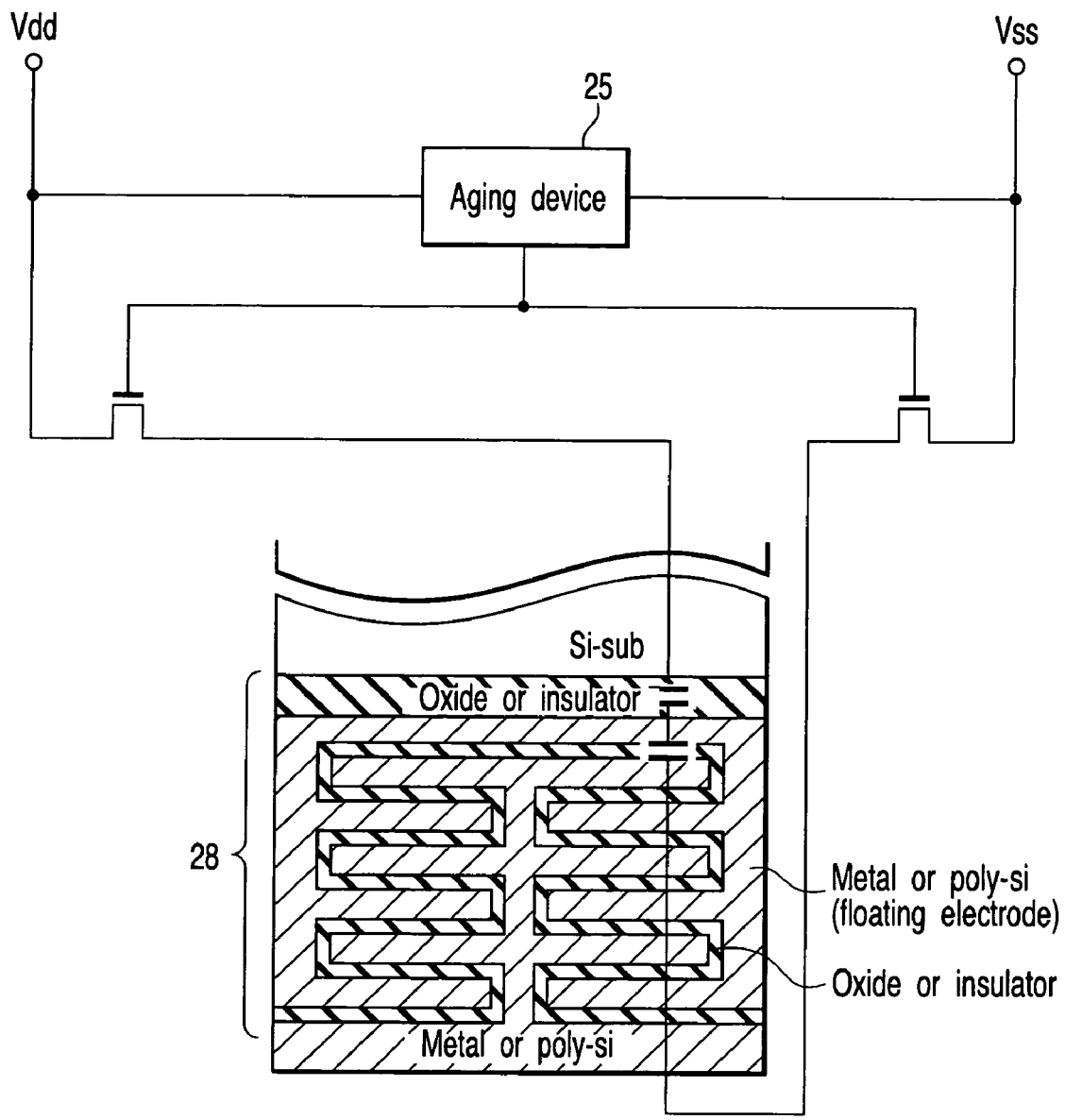
FIG. 13 is a diagram showing an example of a capacitor serving as an internal power source.

FIGS. 12 and 13 each show an example of a capacitor serving as an internal power source.

An aging device, a memory cell array, and a peripheral circuit are formed on one face side of a silicon substrate (Si-sub). Then, a laminate capacitor 28 consisting of an insulating layer (oxide or insulator)—a floating electrode (metal or poly-Si)—an insulating layer (oxide or insulator) structure is formed on the other face side of the silicon substrate.

The laminate capacitor 28 is formed by utilizing the entirety of the other face side of the silicon substrate in order to allocate a large capacitance to the maximum.

In the memory cell array and periphery circuit, the power source electronic potentials Vdd and Vss are supplied from the external device when a memory card is inserted into the external device.

In addition, the laminate capacitor 28 serves as an internal power source when the memory card is removed from the external device.

Here, in the example shown in FIG. 12, an electrode of the laminate capacitor 28 is composed of three electrically conducting layers (one silicon substrate and two electric conductor layers (metal or poly-si)) formed in their opposite plate shape. In the example shown in FIG. 13, a floating electrode of the laminate capacitor 28 has a bellows structure in order to allocate a large capacitance.

Figure 14:
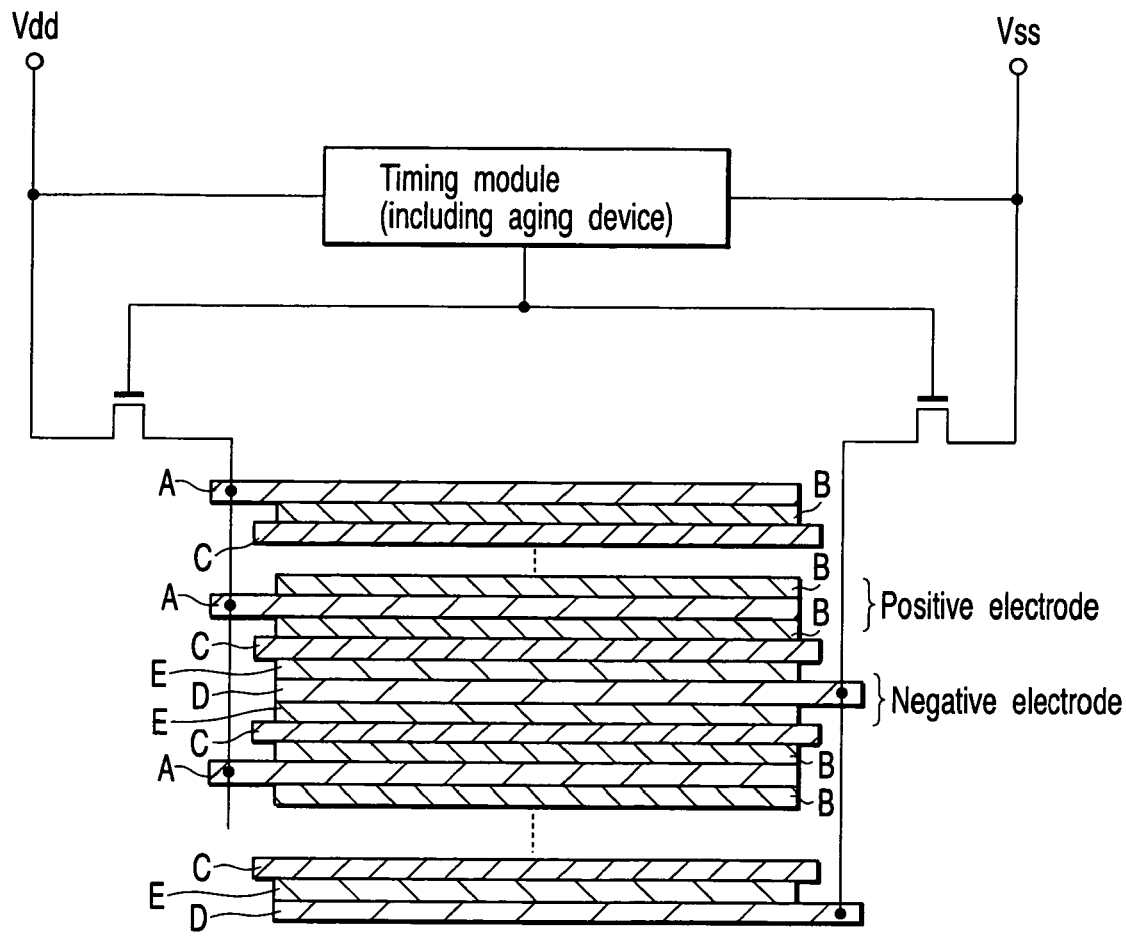
FIG. 14 is a diagram showing an example of a Li ion secondary battery serving as an internal power source.

FIG. 14 shows an example of a Li ion secondary battery serving as an internal power source.

Now, a description will be given with respect to an example in the case where an internal power source composed of Li ion secondary batteries.

Here, a positive collector A is composed of, for example, Al, and a positive electrode mixture B is composed of, for example, a mixture of a positive active material, a binder, and an electric conductor. The positive electrode substance is composed of an oxide such as $LiCoO_2$, the binder is composed of pVDF, and the electric conductor is composed of acetylene black.

Further, a negative electrode power collector D is composed of, for example, Cu, and a negative electrode mixture E is composed of, for example, a mixture of a negative electrode substance and a binder. The negative electrode active substance is composed of Carbon, and a binder is composed of a mixture of styrene butadiene rubber (SBR) and carboxylic methyl cellulose (CMC).

Separator C is used as that obtained by immersing an electrolyte in porous body of PE. The electrolyte is obtained by mixing 1 mol/1-LiPF6 in EC/DEC. pVDF may be used as a negative electrode side binder.

A memory card in this example is assumed to be formed in a card shape (sheet shape), and thus, it is preferable that a Li ion secondary battery is formed in a parallel flat shape. This is because a winding type (cylindrically shaped) battery has high productivity, but is too thick, thus making it difficult to be housed in a card, and a sufficient capacitance cannot be allocated.

However, such a battery shape depends on the shape of a memory card, thus making it possible to use an Li ion secondary battery such as a winding type battery other than a battery formed in a parallel flat shape depending on the shape of a memory card.

In this example, a description has been given while focusing on a power source configuration. Thus, other elements, for example, a step-up circuit, are omitted here.

7. EXAMPLE OF FILE MEMORY

As has already been described, when an example of the present invention is applied, the type of a semiconductor memory serving as a file memory is not limited in particular.

For example, nonvolatile memories such as an EPROM, a flash memory, a ferromagnetic memory, an MRAM, and an OUM can be used.

Figure 15:
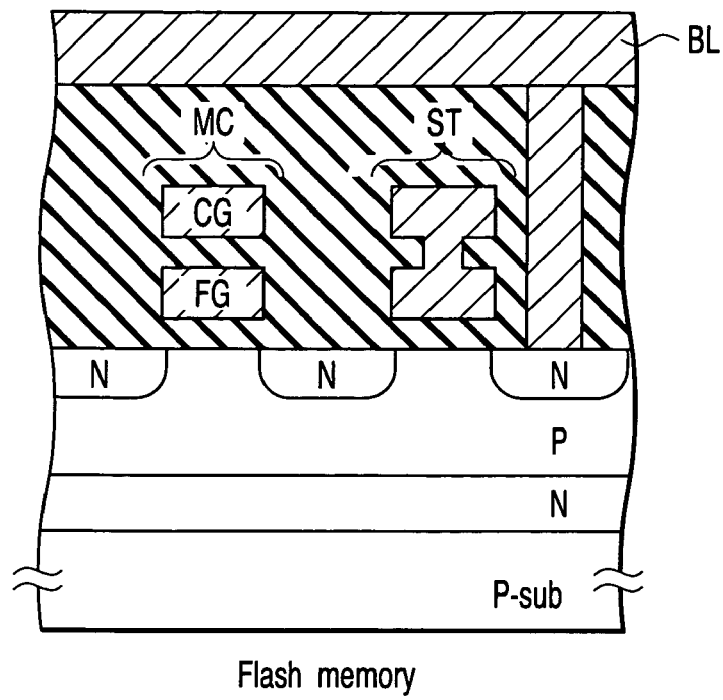
FIG. 15 is a view showing an example of a device structure of a flash memory.
Figure 16:
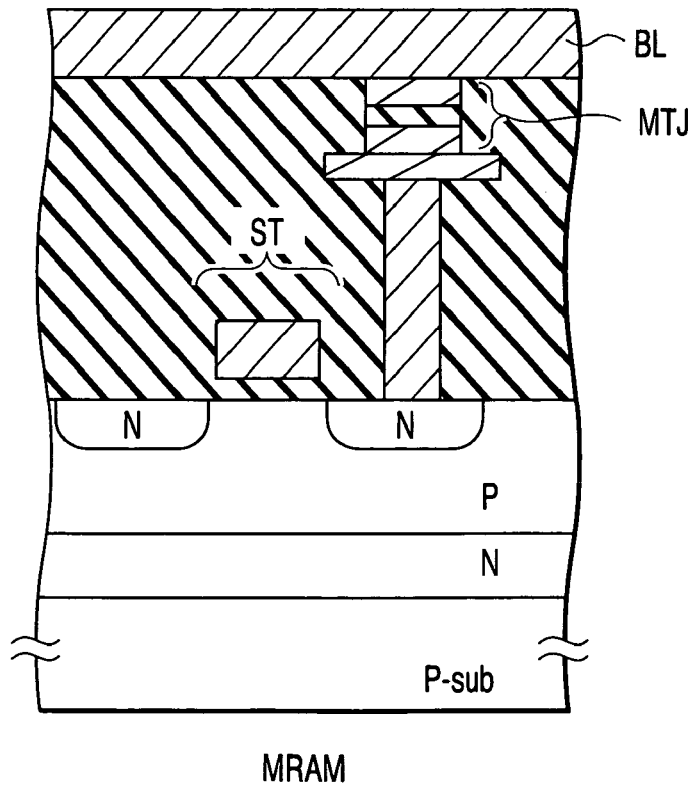
FIG. 16 is a view showing an example of a device structure of an MRAM.

FIG. 15 shows a structural example of memory cells MCs of a flash memory. In addition, FIGS. 16 and 18 each show a structural example of memory cells of an MRAM (magnetic RAM), a PRAM (phase change RAM), and an FeRAM (ferromagnetic RAM), respectively.

The PRAM refers to an OUM (ovonics unified memory).

In particular, in the MRAM and PRAM, thermal disturbance of a magneto tunnel junction (MTJ) element and a phase change (PC) element serving as storage elements due to downsizing becomes problematic. Due to this thermal disturbance, it is likely that the life of memory cells adapted to function as a storage element is shortened.

Refreshing according to an example of the present invention is applied, thereby making it possible to maintain removable property of a memory card having these semiconductor memories incorporated therein and to achieve flattening and size reduction of the memory card due to battery downsizing.

8. EXAMPLE OF AGING DEVICE

A description will be given with respect to an example of an aging device suitable for the memory card according to the example of the present invention. As a memory chip incorporated in the memory card, it is presumed to use a flash memory chip.

(1) BASIC STRUCTURE

Figure 19:
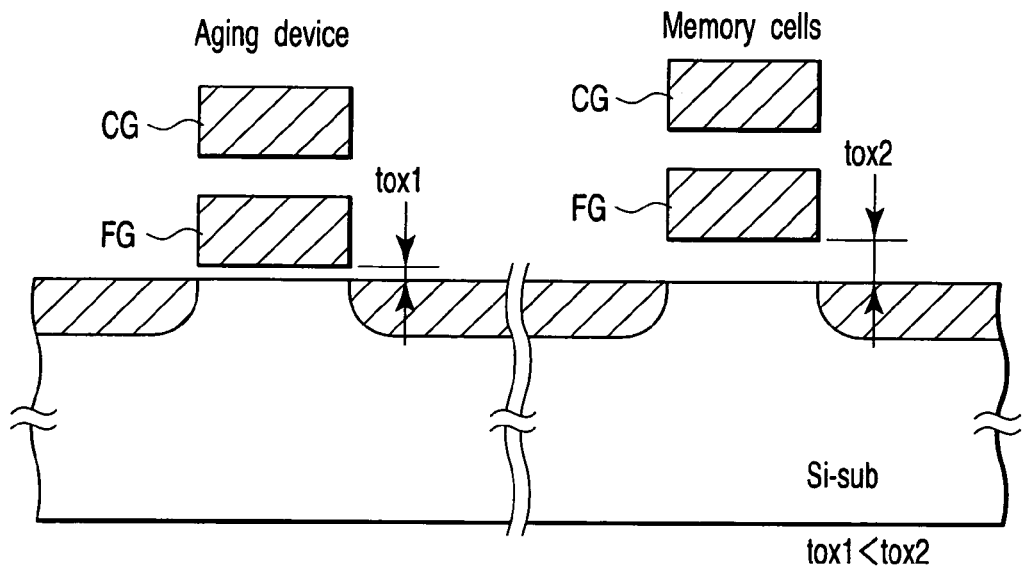
FIG. 19 is a diagram showing an example of an aging device.

An aging device as shown in, for example, FIG. 19, has the completely same structure as memory cells of a flash memory expect that there is provided a gate insulating film (with thickness tox1) which is thinner than a gate insulating film (with thickness tox2) of the memory cells of the flash memory.

Thus, the life of the aging memory is shorter than a data hold time required by the memory cells.

In this way, the life of the aging device is adjusted by the thickness tox1 of the gate insulating film, whereby refreshing can be carried out at a time interval which is shorter than the data hold time required by the memory cells.

A principle of the aging device will be briefly described here.

There are two types of aging devices, i.e., a "normally off type" in which an off state is established when a charge is not injected into a floating gate electrode FG and a "normally on type" in which an on state is established when a charge is not injected into the floating gate electrode FG.

Time counting using the aging device starts immediately after a charge is injected into the floating gate electrode FG of the aging device.

Figure 20:
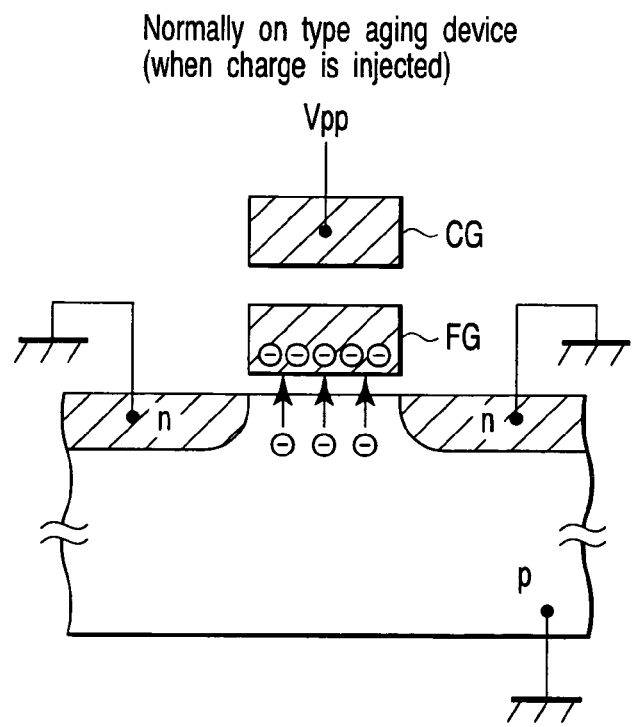
FIG. 20 is a diagram showing a principle of the aging device.

Charge injection as shown in, for example, FIG. 20, is carried out by setting a source/drain and a substrate to Vss (0V); setting a control gate CG to a write electric potential Vpp; and moving a charge to the floating gate FG through FN tunneling, as is the case with a NAND-type flash memory.

In addition, charge injection using hot electrons may be utilized instead of the above charge injection.

In the case of the normally on type aging device, an off state is established when a charge is injected into the floating gate electrode FG, as shown in FIG. 21. Then, the charge in the floating gate electrode FG leaks with an elapse of time, and gradually decreases. After a predetermined time has elapsed, the normally on type aging device is established in the on state.

The time for the on state to be established after this charge injection is the life of the aging device. This time is set to a value which is shorter than the data hold time required by the memory cells.

Time counting using the aging device restarts, when a charge is injected into the floating gate electrode FG as shown in FIG. 20.

(2) SPECIFIC EXAMPLE 1

Figure 22:
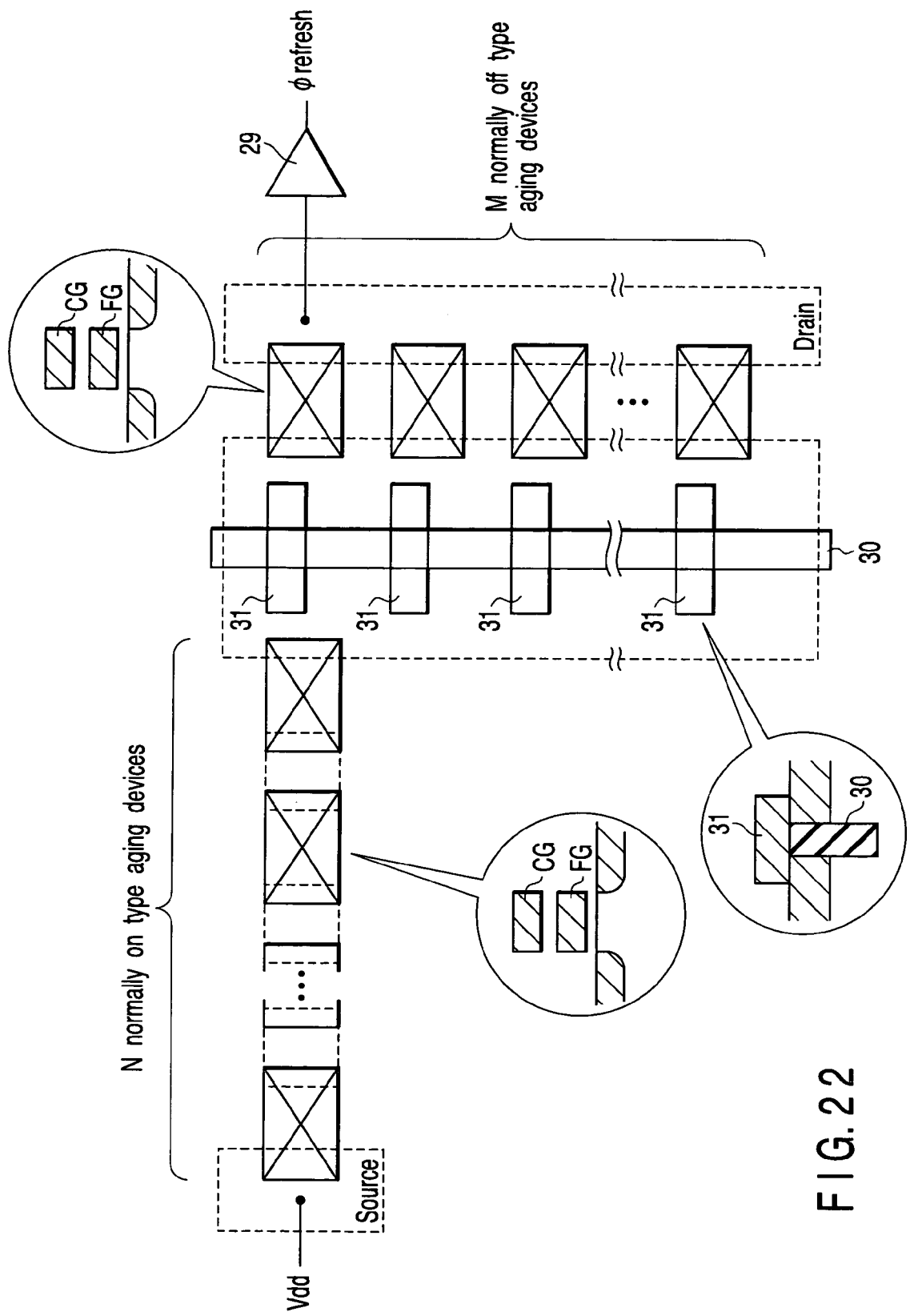
FIG. 22 is a diagram showing a specific example 1 of the aging device.

FIG. 22 shows a specific example 1 of an aging device suitable for the memory card according to the example of the present invention.

In the specific example 1, there are used N (N: two or more) normally on type aging devices connected in series and M (M: two or more) normally off type aging devices connected in parallel.

In preparing N normally on type aging devices in which a design target value of a data hold time is $\tau 1$, the data hold time considering a manufacturing dispersion is obtained as $\tau 1\text{-}1, \tau 1\text{-}2, \ldots \tau 1\text{-}N$, respectively.

In preparing M normally off type aging devices in which a design target value of a data hold time is $\tau 2$, the data hold time including a manufacturing dispersion is obtained as $\tau 2\text{-}1, \tau 2\text{-}2, \ldots \tau 2\text{-}N$, respectively.

In addition, the design target value $\tau 1$ is shorter than the design target value $\tau 2$.

First, the write operation is executed for all of N normally on type aging devices and M normally off type aging devices and charges are injected into the floating gate electrodes FGs of these aging devices. As a result, N normally on type aging devices are set to an off state, and M normally off type devices are set to an on state.

Then, after time $\tau 1$ ($\tau 1\text{-}1, \tau 1\text{-}2, \ldots \tau 1\text{-}N < t1 < \tau 2\text{-}1, \tau 2\text{-}2, \ldots \tau 2\text{-}N$) has elapsed as shown in FIG. 24, all of the normally on type devices are set to an on state, and a level of a refresh signal $\phi$refresh rises.

In addition, when time t2 ($\tau 1\text{-}1, \tau 1\text{-}2, \ldots \tau 1\text{-}N < \tau 2\text{-}1, \tau 2\text{-}2, \ldots \tau 2\text{-}N < t2$) has elapsed, all of M normally off type aging devices are set to an off state, and a level of a refresh signal $\phi$refresh falls.

Times t1 and t2 both are shorter than the data hold time required by the memory cells.

Normally on type aging devices are thus connected in series in order to eliminate the effect of a faulty bit which is extremely short in data hold time. For example, even if one cell is turned on within a time interval which is shorter than a design allowable range, other cells are in an off state, and thus, this off state is kept unchanged as a whole.

Normally off type aging devices are connected in parallel for the same reason. For example, even if one cell is turned off within a time interval which is shorter than a design allowable range, other cells are in an on state, and thus, this on state is kept unchanged as a whole.

Thus, even if a faulty bit occurred, normally on type aging devices are connected in series and normally off type aging devices are connected in parallel, thereby making it possible to prevent an error that refreshing is carried out at an extremely short time interval.

In addition, in this example, normally on type aging devices and normally off type aging devices are further connected in series so that an on state is established as a whole only between time t1 and time t2.

In this manner, a refresh signal $\phi$refresh indicates a pulse waveform as shown in FIG. 24. Thus, as long as refreshing is carried out between time t1 and time t2, there is no need for receiving power source from batteries in another period, thus making it possible to contribute to low power consumption.

(3) SPECIFIC EXAMPLE 2

Figure 23:
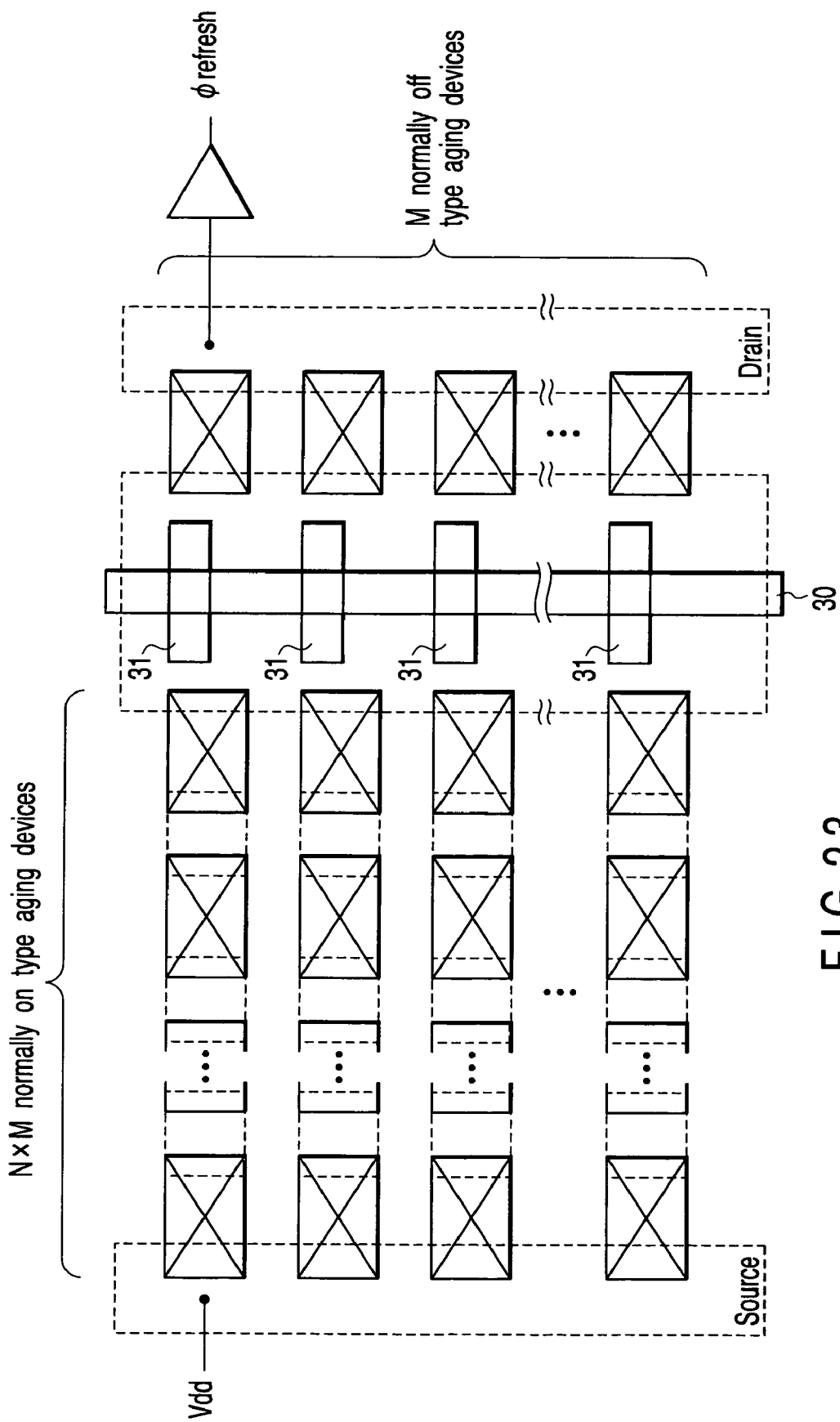
FIG. 23 is a diagram showing a specific example 2 of the aging device.

FIG. 23 shows a specific example 2 of an aging device suitable for the memory card according to the example of the present invention.

The specific example 2, as compared with the specific example 1, is featured in that N (N: two or more) normally on type aging devices connected in series are defined as one unit, and further, several units, for example, M units are connected in parallel, for example.

The reason why N normally on type aging devices connected in series (serial chain) are further connected in parallel is as follows.

First, in serial chains 1 to M, the longest data hold time required by cells configuring their respective serial chains determines the data hold time in the respective serial chains, and thus, these serial chains each are defined as τmax1, τmax2, . . . τmaxM.

These serial chains are further connected in parallel, whereby the whole data hold time required by N×M normally on type aging devices is determined by any one of τmax1, τmax2, . . . τmaxM, which has the shortest value.

Thus, after effect caused by a faulty bit has been eliminated by N normally on type aging devices connected in series, a dispersion distribution among aging devices is returned to the short life side by M units connected in parallel, and a dispersion in data hold time caused by a shape dispersion can be reduce to the minimum.

Other constituent elements are identical to those according to the specific example 1.

(4) SPECIFIC EXAMPLE 3

Figure 25:
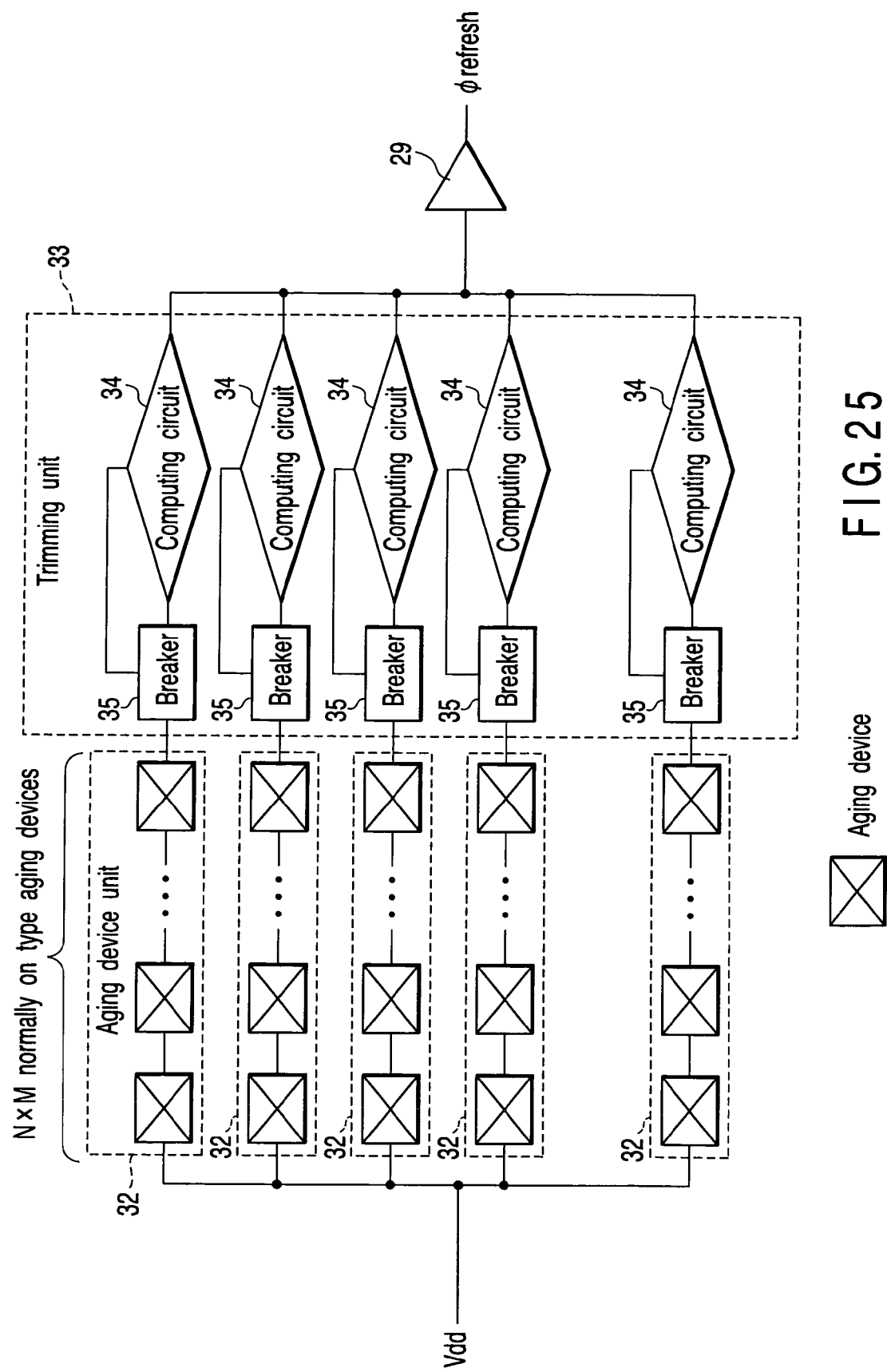
FIG. 25 is a diagram showing a specific example 3 of the aging device.

FIG. 25 shows a specific example 3 of an aging device suitable for the memory card according to the example of the present invention.

In the specific example 3, N normally on type aging devices connected in series (serial chain) are defined as one unit, and further, M units are connected in parallel, and the start or end of refreshing is instructed by a rise of a level of the refresh signal φrefresh.

Each of the M units is referred to as an aging device unit 32.

M aging device units 32 are connected in parallel to each other, and each of M aging device units 32, a computing circuit 34, and a breaker 35 are connected in series to each other. M computing circuits 34 and M breakers 35 are referred to as a trimming unit 33 in all.

N×M normally on type aging devices are provided for the purpose of eliminating the effect caused by a dispersion in data hold time caused by a shape dispersion of aging devices, as described in the specific examples 1 and 2. However, the trimming unit 33 is further provided for the purpose of dispersion control with high precision.

The computing circuit 34 detects each of the currents flowing through the computing circuit 34 when there is established a write state in which a charge has been injected into a floating gate electrode FG of an aging device, and shuts down a current path by the breaker 35 in the case where the values of these currents are not within a predetermined range.

In this manner, an aging device unit 32 which is not within a desired precision range is not used for detection of a refresh signal φrefresh.

With respect to the breaker 35, any element may be used as long as it has a function capable of shutting down a current path by a signal from the computing circuit 34.

Figure 26:
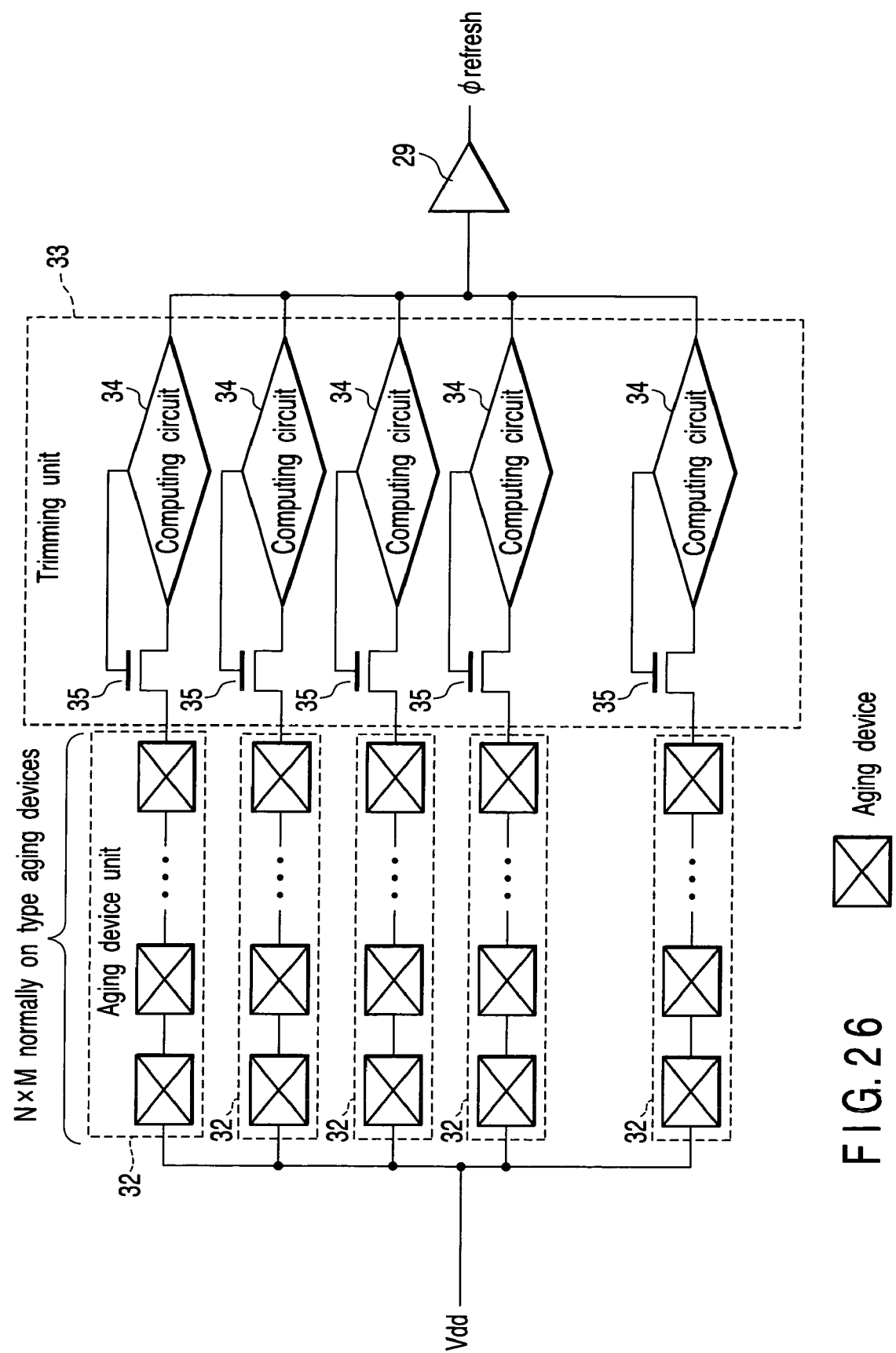
FIG. 26 is a diagram showing a modified example of the specific example 3 of the aging device.
Figure 27:
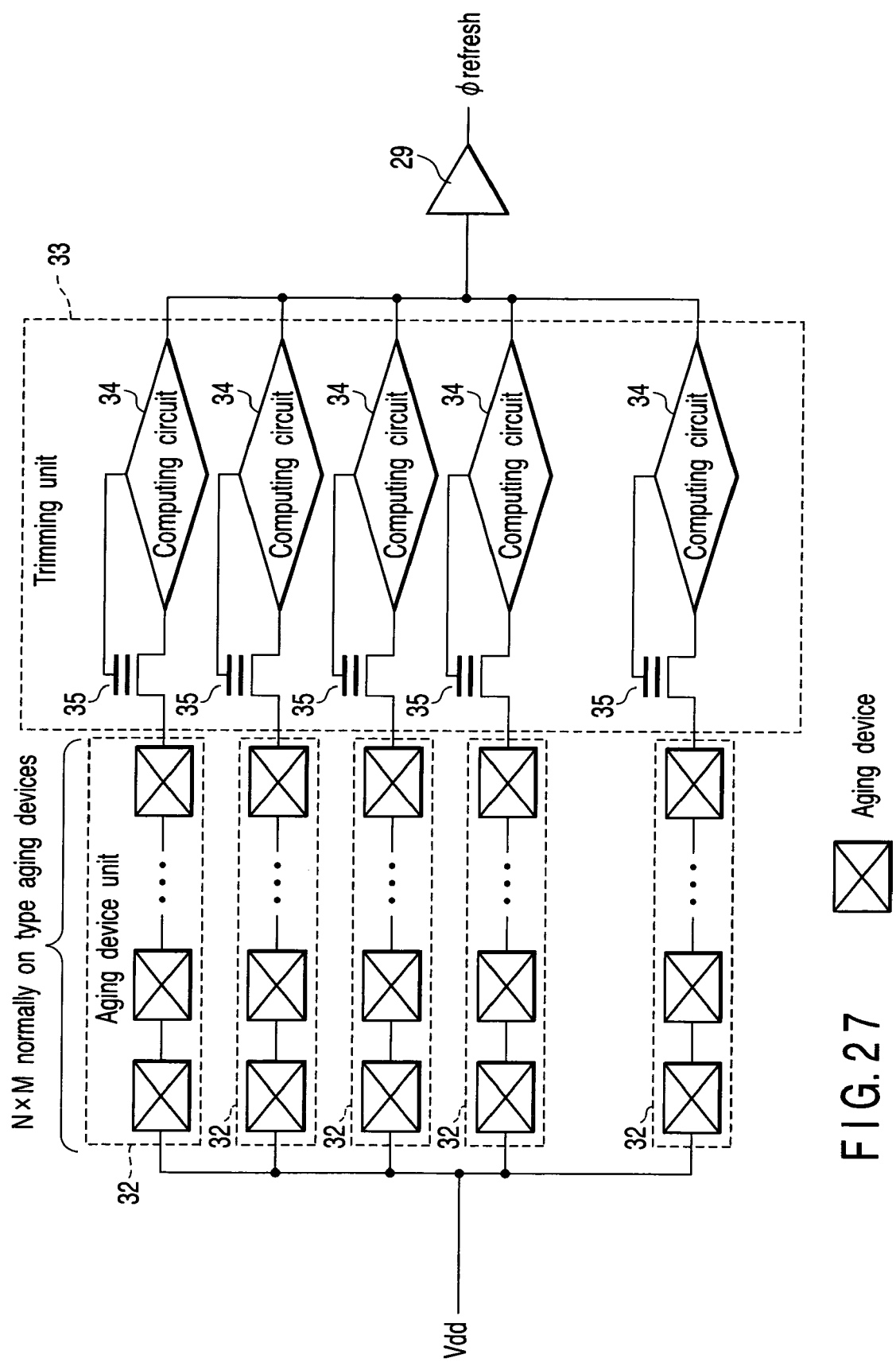
FIG. 27 is a diagram showing a modified example of the specific example 3 of the aging device.

For example, the breaker 35 can be composed of MOS transistors as shown in FIG. 26, and can be composed of memory cells of a flash memory as shown in FIG. 27.

In addition, the breaker 35 can be composed of elements having a function of breaking wires by means of electro migration such as an E (electric)-fuse.

Figure 28:
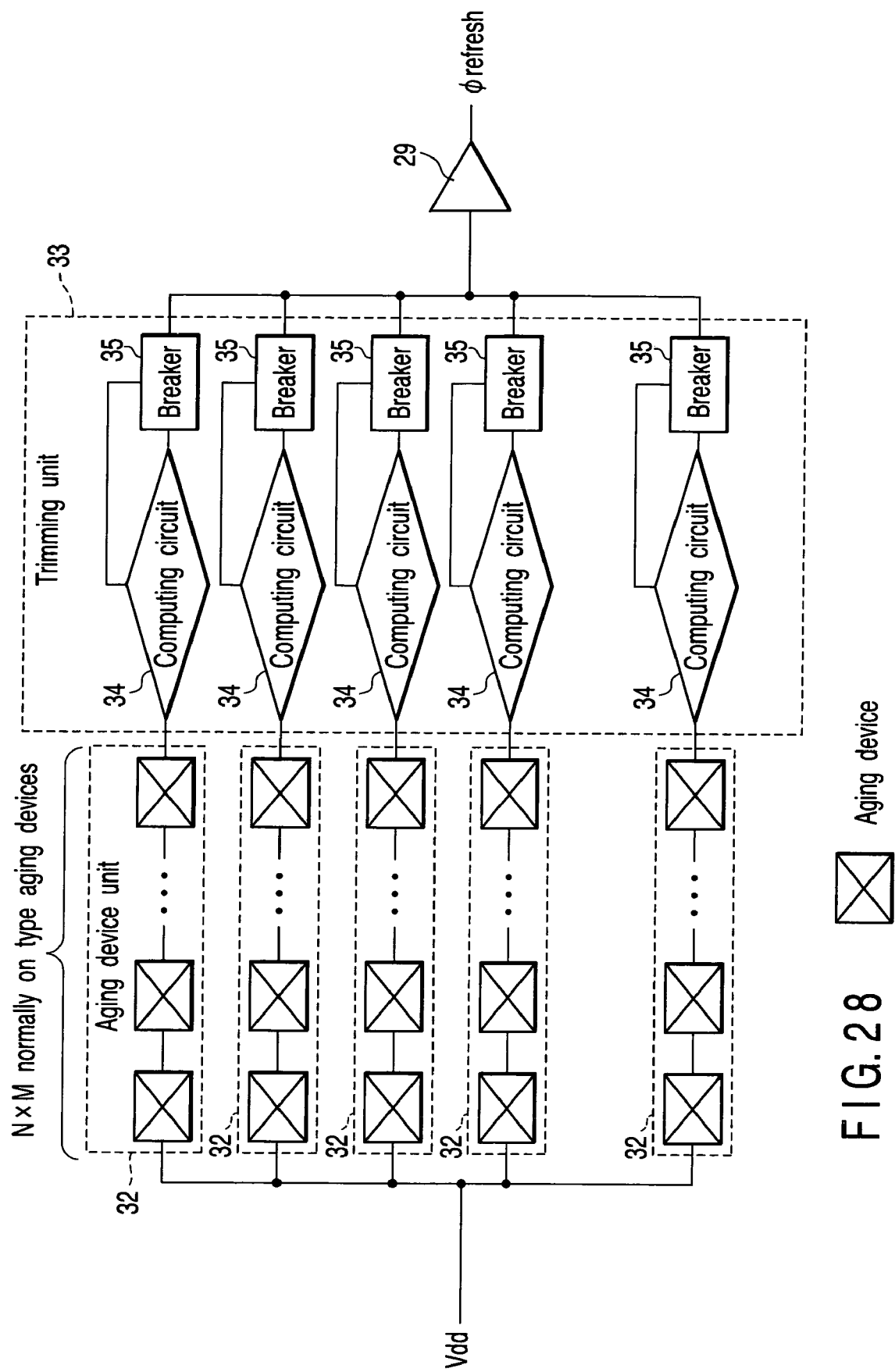
FIG. 28 is a diagram showing a modified example of the specific example 3 of the aging device.

With respect to the trimming unit 33, a position of the computing circuit 34 and that of the breaker 35 can be changed with each other as shown in FIG. 28.

Figure 29:
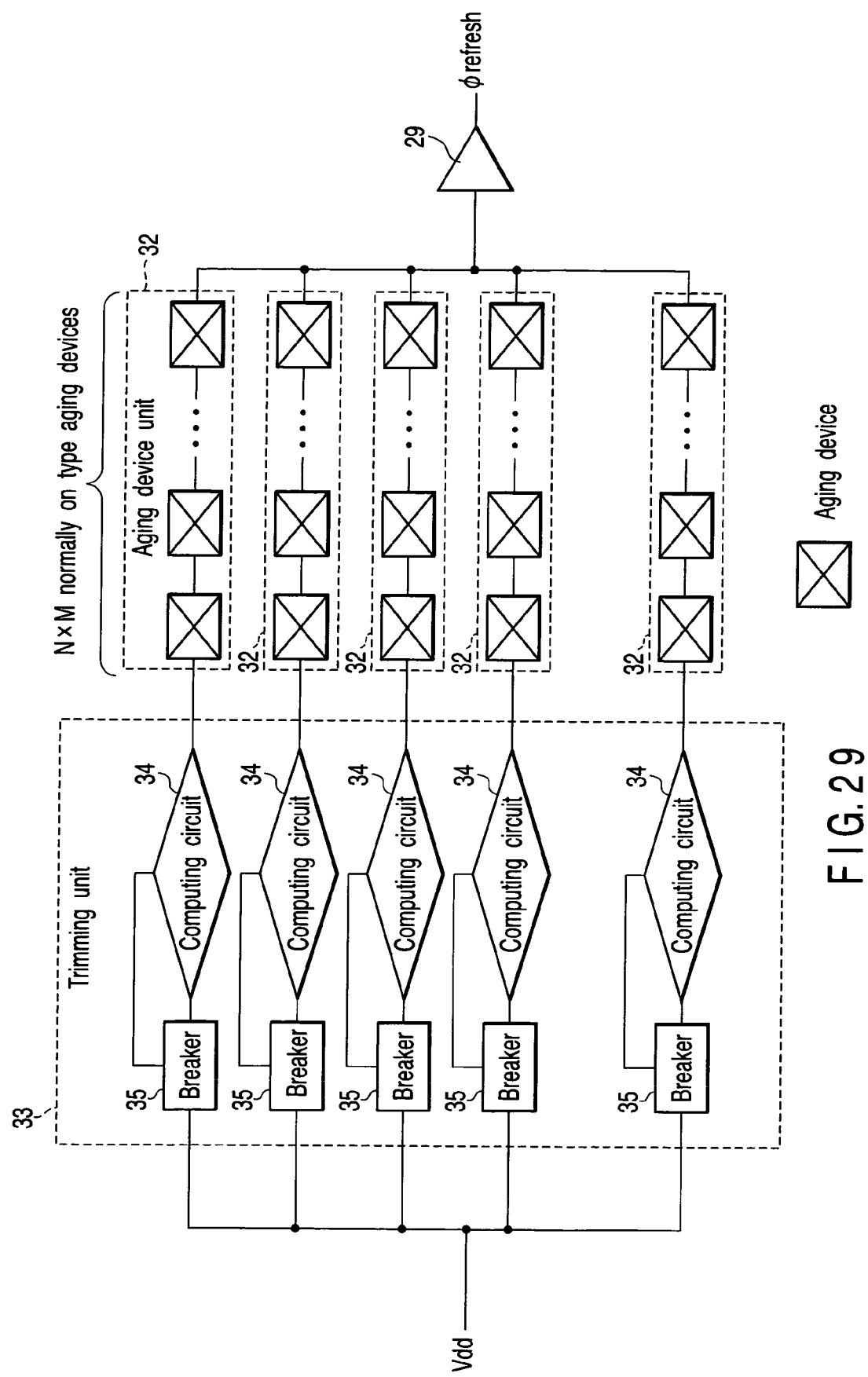
FIG. 29 is a diagram showing a modified example of the specific example 3 of the aging device.
Figure 30:
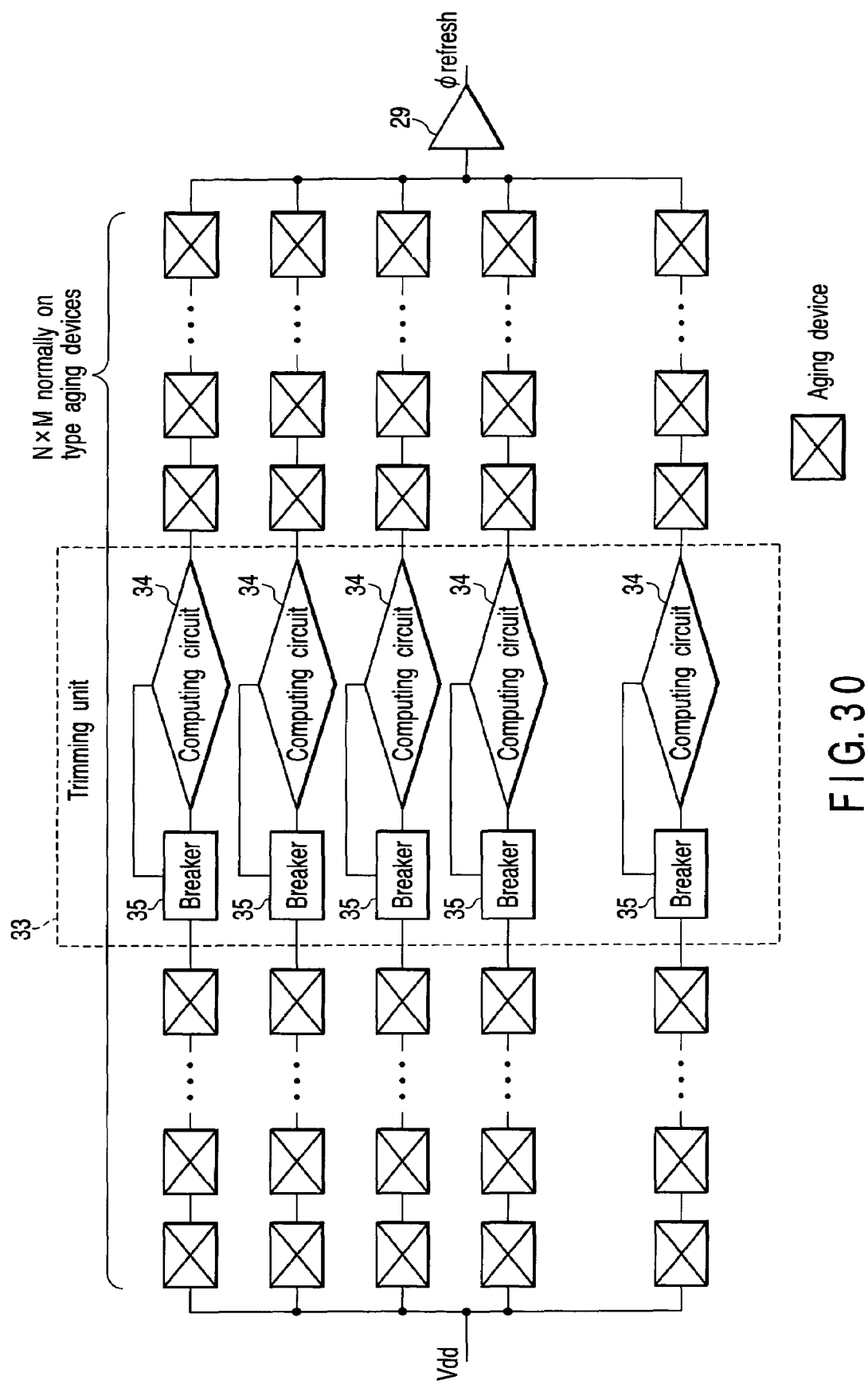
FIG. 30 is a diagram showing a modified example of the specific example 3 of the aging device.

In addition, the trimming unit 33 may be allocated at a front stage portion of N×M normally on type aging devices as shown in FIG. 29 or may be allocated at a center portion of N×M normally on type aging devices as shown in FIG. 30.

Figure 31:
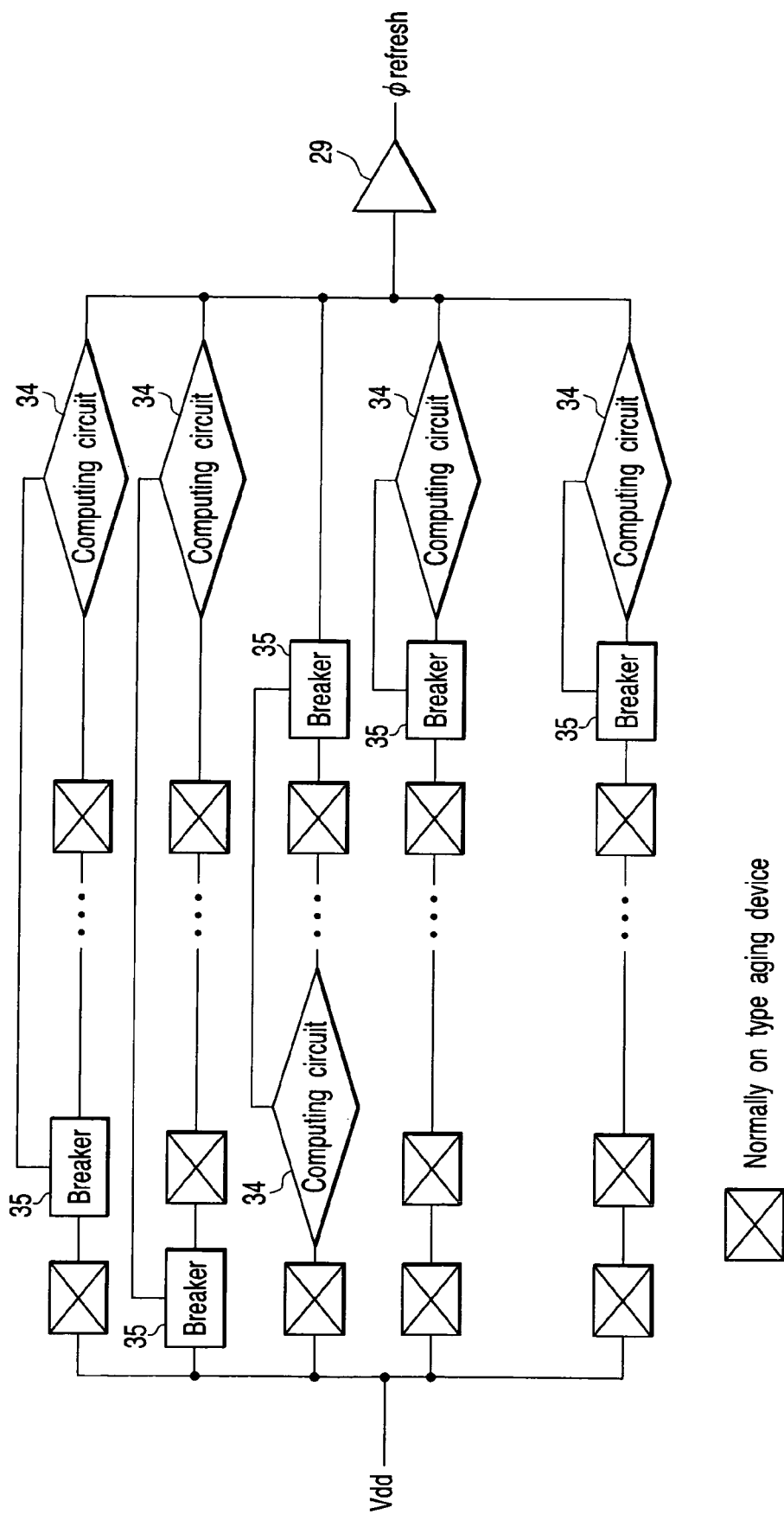
FIG. 31 is a diagram showing a modified example of the specific example 3 of the aging device.

Further, as shown in FIG. 31, a positional relation between the computing circuit 34 or the breaker 35 and the aging device may be set in random.

With such a configuration, a faulty bit is eliminated and the controllability of the data hold time can be remarkably improved by the trimming unit. For example, in the case where this unit has been used as a refresh control circuit of a semiconductor memory in a memory card, the data hold time required by memory cells can be precisely managed.

(5) SPECIFIC EXAMPLE 4

Figure 32:
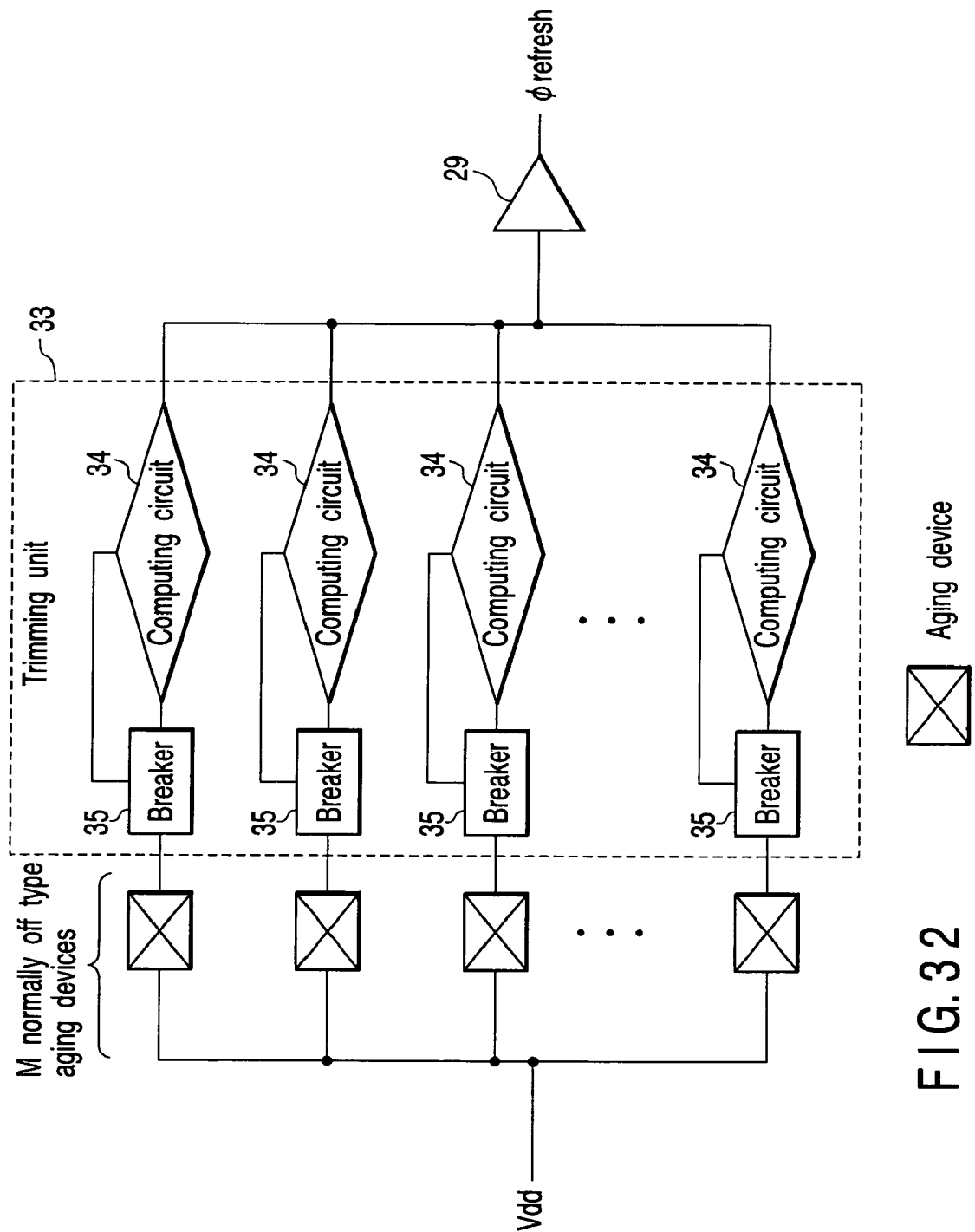
FIG. 32 is a diagram showing a specific example 4 of an aging device.

FIG. 32 shows a specific example 4 of an aging device suitable for the memory card according to the example of the present invention.

In the specific example 4, a refresh control circuit is composed of M (M: two or more) normally off type aging devices connected in parallel, and the start or end of refreshing is instructed by a fall of a level of a refresh signal φrefresh.

M aging devices are connected in parallel to each other and each of M aging devices, the computing device 34, and the breaker 35 are connected in series to each other. M computing circuits 34 and M breakers 35 are referred to as a trimming unit 33 in all.

M normally off type aging devices, as described in the specific examples 1 and 2, are provided for the purpose of eliminating the effect caused by a dispersion in data hold time due to a shape dispersion of the aging devices.

The trimming unit 33 further improves its dispersion controllability.

The computing circuit 34 detects each of the currents flowing through the computing circuit 34 when there is established a write state in which a charge has been injected into a floating gate electrode FG of the aging device, and shuts down a current path by the breaker 35 in the case where the values of these currents are not within a predetermined range.

In this manner, the aging device unit which is not within a desired precision range is not used for detection of a refresh signal φrefresh.

With respect to the breaker 35, any element such as a MOS transistor, memory cells of a flash memory or an E-fuse may be used as long as it has a function capable of shutting down a current path by a signal from the computing circuit 34, as in the specific example 3.

Figure 33:
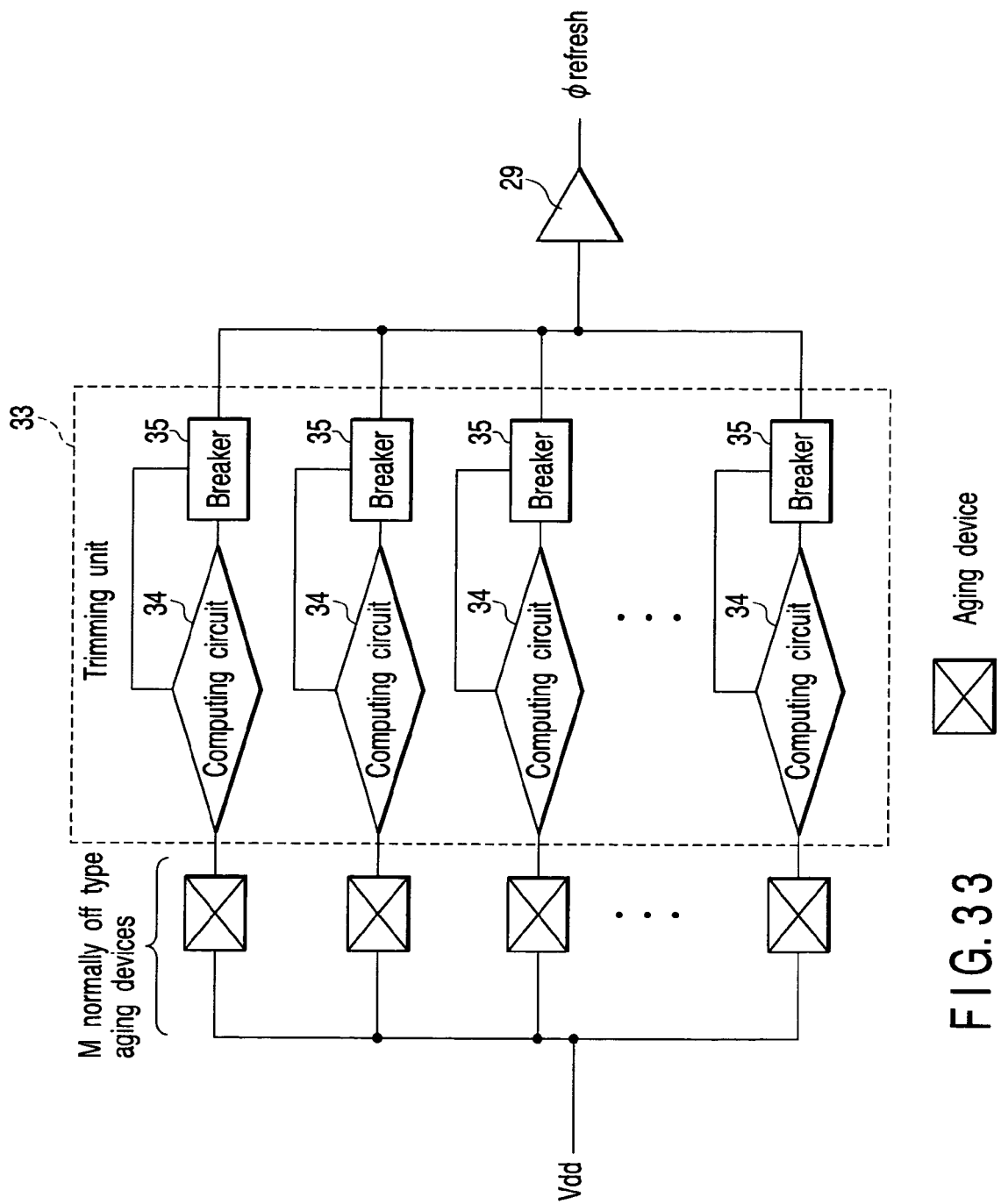
FIG. 33 is a diagram showing a modified example of the specific example 4 of the aging device.

With respect to the trimming unit 33, the position of the computing circuit 34 and that of the breaker 35 can be changed with each other as shown in FIG. 33.

Figure 34:
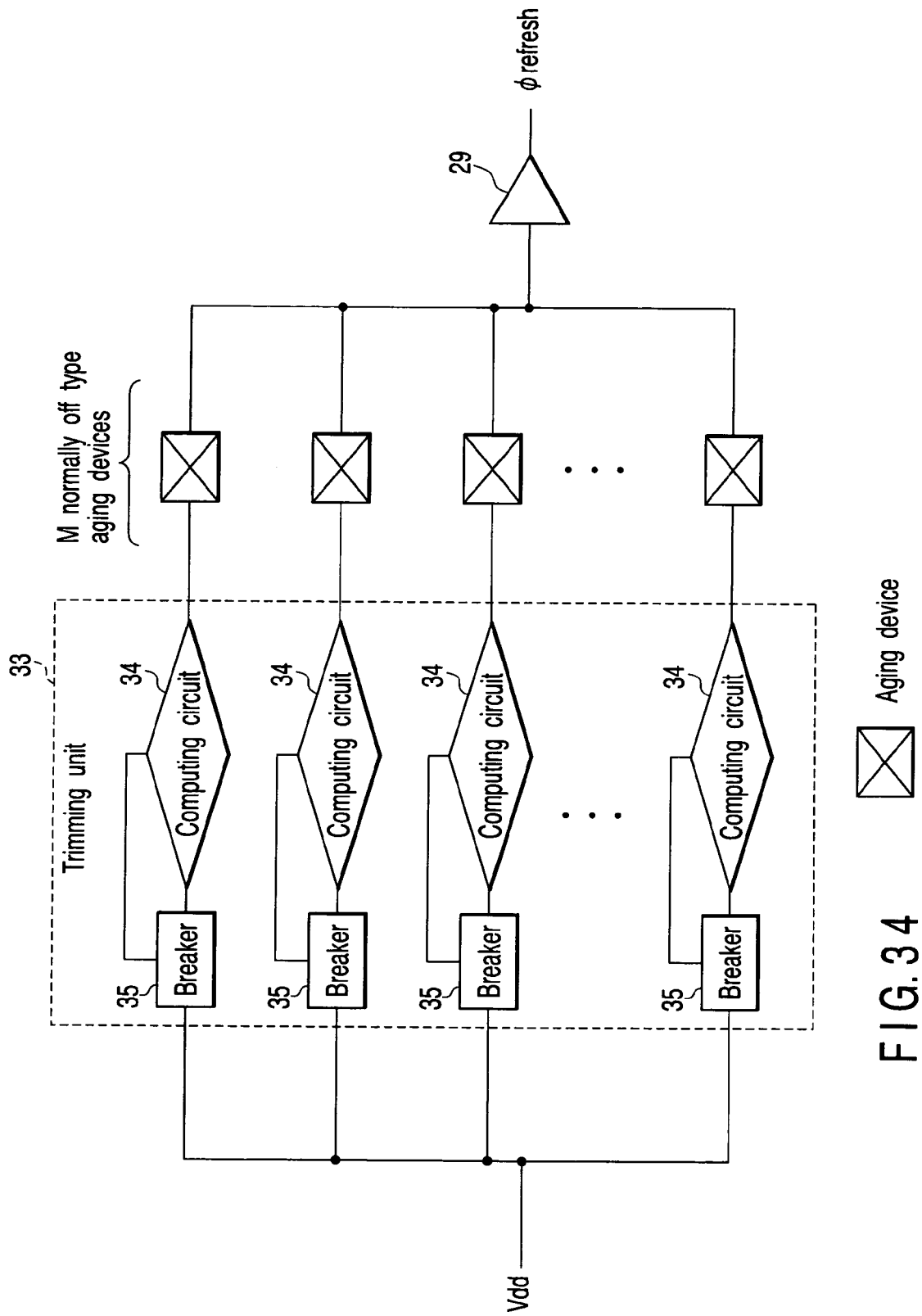
FIG. 34 is a diagram showing a modified example of the specific example 4 of the aging device.

In addition, the trimming unit 33 may be allocated at the front stage portion of the M normally off type aging devices as shown in FIG. 34.

Figure 35:
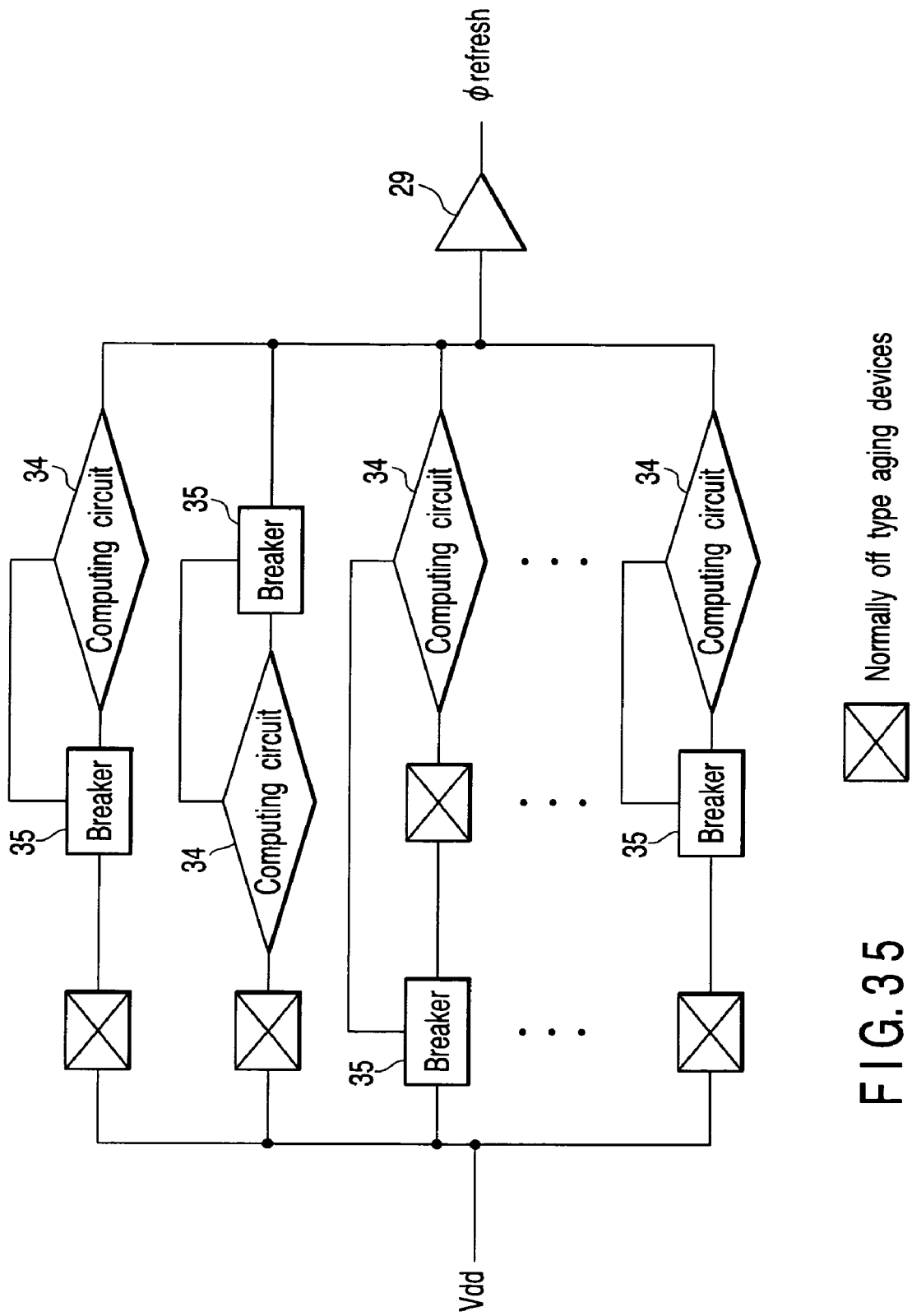
FIG. 35 is a diagram showing a modified example of the specific example 4 of the aging device.

Further, the computing circuit 34, the breaker 35, and the aging devices may be located in random order as shown in FIG. 35.

With such a configuration, dispersion in data hold time can be eliminated and a faulty bit can be eliminated at the same time. For example, in the case where this circuit is used as a refresh control circuit of a semiconductor memory in a memory card, the data hold time required by memory cells can be precisely managed.

(6) OTHERS

In the specific example 3, the start or end of refreshing is instructed by a rise of the level of the refresh signal φrefresh. In the specific example 4, the start or end of refreshing is instructed by a fall of the level of the refresh signal φrefresh.

Figure 36:
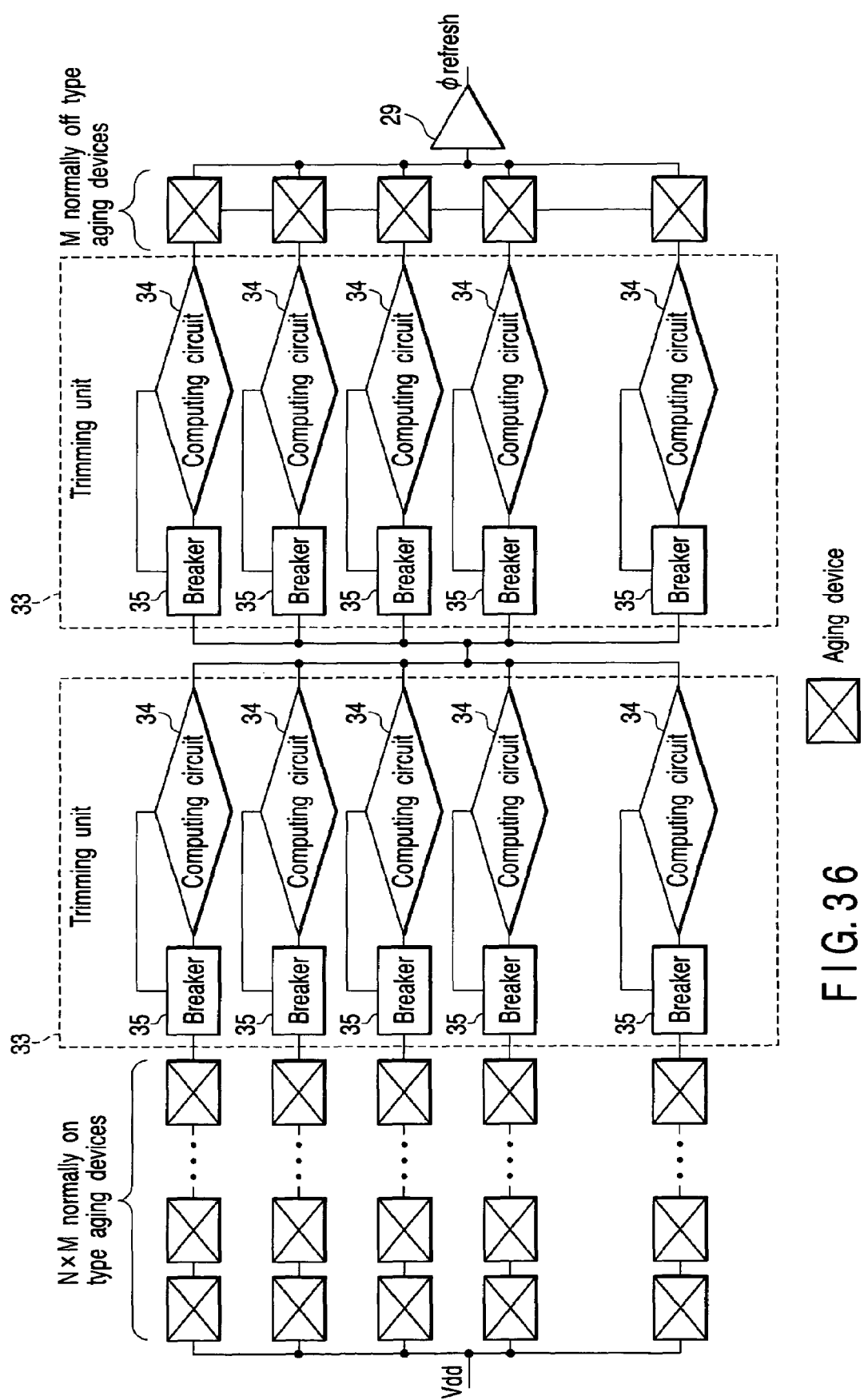
FIG. 36 is a diagram showing an example of a combination between the specific example 3 and the specific example 4.

Here, a refresh control circuit can be produced by using a combination of the specific examples 3 and 4. As shown in, for example, FIG. 36, a pulse waveform as shown in FIG. 24 can be produced by using a combination of FIGS. 25 and 34.

In this case, refreshing is started by a rise of the refreshing signal φrefresh, and refreshing is ended by a fall of the refreshing signal φrefresh. With respect to the aging device, devices except the above-described specific examples 1 to 4, for example, devices shown in U.S. Pat. No. 6,707,748, are also accepted. However, it is preferable to make some change so as to adapt to management of the data hold time required by the semiconductor memory in the memory card.

In the case where an aging device is composed of memory cells of a floating gate, either of P-channel type or N-channel type may be used. Further, the charges injected into a floating gate electrode FG may be electrons or positive holes.

Whether to use an aging device of normally on type or normally off type is determined depending on type of a charge injected into these electric conducting type and floating gate electrode FG.

9. APPLICATION EXAMPLE

Currently, various types of memory cards are commercially available. With the advancement of higher capacitance of a memory chip in a memory card, it is expected that reduction of a data hold time required by a semiconductor memory will become a large problem to be solved in the future. An example of the present invention is very efficient means in solving this problem.

For example, the size of a memory card is about 2.2 cm (length)×about 2.2 cm (width)×2 mm (thickness), and thus, as a internal battery, a Li ion secondary battery of a maximum of about 2 cm (length)×about 2 cm (width)×about 0.4 mm (thickness) can be incorporated in a memory card. In this case, when refreshing is executed in units of about one week, it becomes possible store data in a semi-permanent manner even if no charging is carried out.

It is preferable to configure a battery or a capacitor as a power source so that an average discharge voltage is set to 20 V or more during 1C discharge. The 1C used here refers to a discharge current such that discharging can be completed within one hour after a fully charged state.

In addition, the memory chip size is as small as about 5 mm×about 5 mm. In the case where a battery is used for a power source, it is preferable that its size is reduced so as to be substantially equal to the memory chip size.

An example of the present invention is suitable for a memory card having a semiconductor memory in which a data hold time is within a range of 1 second to six months ($1.5 \times 10^7$ seconds).

10. OTHERS

As has been described above, according to an example of the present invention, a data hold time required by a file memory incorporated in a memory card is managed with slight power consumption, and refreshing is carried out, thereby making it possible to substantially extend the data hold time and downsize batteries and to maintain removable property of the memory card.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data recording device comprising:
   a semiconductor memory;
   a refresh circuit which executes a refreshing of data of the semiconductor memory;
   a refresh control circuit which manages a data hold time of the semiconductor memory for refreshing at a time period which is shorter than the data hold time; and
   an internal power source which supplies power for executing the refreshing in a state in which the data recording device is removed from an external device.

2. The data recording device according to claim 1, wherein the refresh circuit, the refresh control circuit and the semiconductor memory are all embedded on a chip, and the internal power source is included in the data recording device together with the chip.

3. The data recording device according to claim 1, wherein the refresh circuit, the refresh control circuit, the internal power source and the semiconductor memory are embedded on a chip.

4. The data recording device according to claim 1, further comprising a charge circuit, charging the internal power source when the data recording device is inserted into the external device.

5. The data recording device according to claim 1, wherein the internal power source is a battery or a capacitor.

6. The data recording device according to claim 1, wherein management of the data hold time is carried out by a timer.

7. The data recording device according to claim 1, wherein management of the data hold time is carried out by an aging device having a structure which is the same as the semiconductor memory except thickness of a gate insulating film.

8. The data recording device according to claim 1, wherein the data hold time is 1 second or more and 6 months or less.

9. The data recording device according to claim 1, wherein the semiconductor memory is one selected from among an EPROM, a flash memory, a ferromagnetic memory, an MRAM, and a phase change RAM.

10. The data recording device according to claim 1, wherein the capacitor is allocated on a back face of a chip having the refresh circuit, the refresh control circuit and the semiconductor memory incorporated thereon.

11. A data recording device comprising:
    a semiconductor memory;
    a refresh circuit which executes a refreshing of data of blocks or pages of the semiconductor memory;

a refresh control circuit which manages a data hold time of each block or each page of the semiconductor memory, for refreshing at a time interval which is shorter than the data hold time;

a directive memory which stores a history of a write/erase operation of the each block or the each page; and an internal power source which supplies power for executing the refreshing in response to the history in a state in which the data recording device is removed from an external device.

12. The data recording device according to claim 11, wherein the directive memory is comprised of memory cells each having the same structure as a memory cell of the semiconductor memory.

13. The data recording device according to claim 11, wherein the refreshing is executed with respect to the directive memory as well.

14. The data recording device according to claim 11, wherein the refresh circuit, the refresh control circuit and the semiconductor memory are all embedded on a chip, and the internal power source is included in the data recording device together with the chip.

15. The data recording device according to claim 11, wherein the refresh circuit, the refresh control circuit, the internal power source and the semiconductor memory are all embedded on the chip.

16. The data recording device according to claim 11, further comprising a charge circuit to, when the data recording device is inserted into the external device, charge the internal power source.

17. The data recording device according to claim 11, wherein the internal power source is a battery or a capacitor.

18. The data recording device according to claim 11, wherein management of the data hold time is carried out by a timer.

19. The data recording device according to claim 11, wherein management of the data hold time is carried out by an aging device having a same structure as a memory cell of the semiconductor memory except the thickness of a gate insulating film.

20. The data recording device according to claim 11, wherein the data hold time is 1 second or more and 6 months or less.

21. The data recording device according to claim 11, wherein the semiconductor memory is one selected from among an EPROM, a flash memory, a ferromagnetic memory, an MRAM, and a phase change RAM.

22. The data recording device according to claim 11, wherein the capacitor is allocated on a back face of a chip having the refresh circuit, the refresh control circuit and the semiconductor memory incorporated thereon.

* * * * *